US012793790B2

(12) United States Patent
Yamaki

(10) Patent No.: US 12,793,790 B2
(45) Date of Patent: Nov. 10, 2026

(54) NON-VOLATILE MEMORY AND CONTROLLING METHOD OF NON-VOLATILE MEMORY

(71) Applicant: Kioxia Corporation, Tokyo (JP)

(72) Inventor: Ryo Yamaki, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 116 days.

(21) Appl. No.: 18/982,170

(22) Filed: Dec. 16, 2024

(65) Prior Publication Data

US 2025/0299745 A1 Sep. 25, 2025

(30) Foreign Application Priority Data

Mar. 19, 2024 (JP) ................................ 2024-043923

(51) Int. Cl.
*G11C 16/26* (2006.01)
*G11C 16/08* (2006.01)
*G11C 16/32* (2006.01)

(52) U.S. Cl.
CPC .............. *G11C 16/26* (2013.01); *G11C 16/08* (2013.01); *G11C 16/32* (2013.01)

(58) Field of Classification Search
CPC .......... G11C 16/26; G11C 16/08; G11C 16/32
See application file for complete search history.

(56) References Cited

U.S. PATENT DOCUMENTS 9,875,804 B2 1/2018 Tokiwa
2015/0302937 A1* 10/2015 Roberts ................ G11C 13/004 365/201
2016/0225440 A1* 8/2016 Han .................. G11C 16/3404
2017/0255385 A1 9/2017 Tokiwa
2018/0294036 A1* 10/2018 Oh .................. G11C 29/50004
2020/0211655 A1* 7/2020 Shibata .................. H10B 43/27
2021/0390986 A1 12/2021 Majerus
2022/0043596 A1 2/2022 Madraswala et al.
(Continued)

FOREIGN PATENT DOCUMENTS

JP 2017157259 A 9/2017

OTHER PUBLICATIONS

Doo-hyun Kim et al., "A 1Tb 4b/cell NAND Flash Memory with tprog=2ms, tR=110μs and 1.2Gb/s High-Speed IO Rate", 2020 IEEE: International Solid-State Circuits Conference (ISSCC), Session 13, Non-Volatile Memories/ 13.1, 2020, 3 pages.
(Continued)

*Primary Examiner* — Min Huang
(74) *Attorney, Agent, or Firm* — Maier & Maier, PLLC

(57) ABSTRACT

According to an embodiment, a non-volatile memory includes a plurality of memory cells; a word line; and a controller, wherein, in a read process, the controller reads data from the memory cells at a first timing, a second timing, and a third timing while a first voltage is applied to the word line, calculates a first difference based on the data at the first timing and the second timing, a second difference based on the data at the second timing and the third timing, and a first value subtracted the first difference from the second difference, and determines, based on the first value, one of the data at the first timing, the data at the second timing, and the data at the third timing as a plurality of first read data.

20 Claims, 17 Drawing Sheets

(56) References Cited

U.S. PATENT DOCUMENTS

| | | | |
|---|---|---|---|
| 2022/0301640 | A1 | 9/2022 | Liikanen et al. |
| 2023/0057289 | A1 | 2/2023 | Kalluru et al. |

OTHER PUBLICATIONS

Wanik Cho et al., "A 1-Tb, 4b/Cell, 176-Stacked-WL 3D-NAND Flash Memory with Improved Read Latency and a 14.8Gb/mm2 Density", 2022 IEEE: International Solid-State Circuits Conference (ISSCC), Session 7, NAND Flash Memory/7.3, 2022, 2 pages.

Ali Khakifirooz et al., "A 1Tb 4b/Cell 144-Tier Floating-Gate 3D-NAND Flash Memory with 40MB/s Program Throughput and 13.8Gb/mm2 Bit Density", 2021 IEEE: International Solid-State Circuits Conference (ISSCC), Session 30, Non-Volatile Memories/30.2, 2021, 3 pages.

Ali Khakifirooz et al., "A 1.67Tb, 5b/Cell Flash Memory Fabricated in 192-Layer Floating Gate 3D-NAND Technology and Featuring a 23.3 Gb/mm2 Bit Density", IEEE: Solid-State Circuits Letters, vol. 6, 2023, 10 pages.

* cited by examiner

| Page | Data | | | | | | | |
|---|---|---|---|---|---|---|---|---|
| Upper | 1 | 1 | 1 | 0 | 0 | 0 | 0 | 1 |
| Middle | 1 | 1 | 0 | 0 | 1 | 1 | 0 | 0 |
| Lower | 1 | 0 | 0 | 0 | 0 | 1 | 1 | 1 |

| Read voltage | Default value | Shift amount |
|---|---|---|
| VA | VAdef | CVA |
| VB | VBdef | CVB |
| VC | VCdef | CVC |
| VD | VDdef | CVD |
| VE | VEdef | CVE |
| VF | VFdef | CVF |
| VG | VGdef | CVG |

FIG. 16

NON-VOLATILE MEMORY AND CONTROLLING METHOD OF NON-VOLATILE MEMORY

CROSS-REFERENCE TO RELATED APPLICATIONS

This application is based upon and claims the benefit of priority from Japanese Patent Application No. 2024-043923, filed Mar. 19, 2024, the entire contents of which are incorporated herein by reference.

FIELD

Embodiments described herein relate generally to a non-volatile memory and a controlling method of a non-volatile memory.

BACKGROUND

NAND flash memories capable of storing data in a non-volatile manner are known.

BRIEF DESCRIPTION OF THE DRAWINGS

FIG. 16 is a diagram illustrating an example of the shift amount table used in the memory system according to the second embodiment.

DETAILED DESCRIPTION

Figure 1:
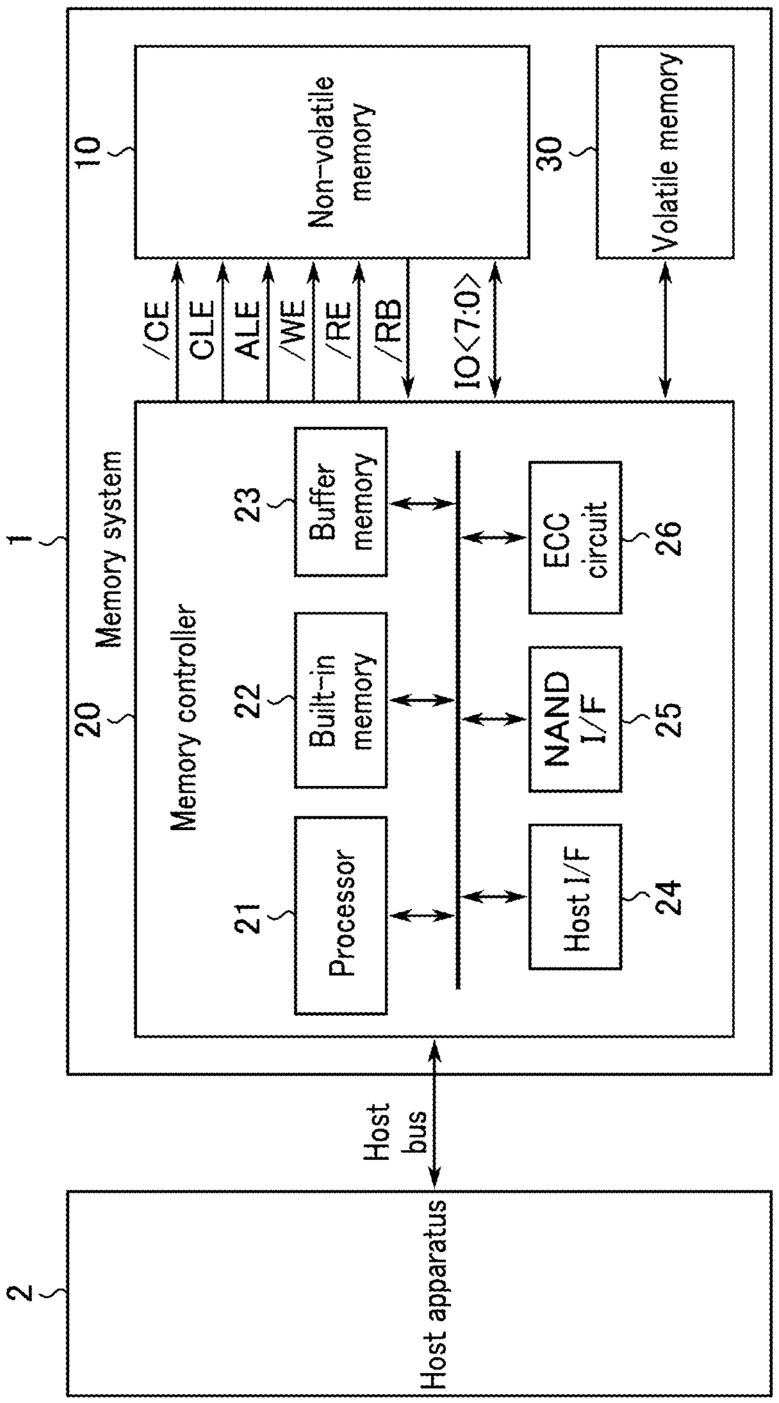
FIG. 1 is a block diagram illustrating an example of a configuration of an information processing system including a memory system and a host apparatus according to the first embodiment.

In general, according to one embodiment, a non-volatile memory includes a plurality of memory cells; a word line coupled to the memory cells; and a controller configured to perform a read process to read data from the memory cells by applying a voltage to the word line, wherein, in a read process for the memory cells, the controller is configured to apply a first voltage to the word line, read data from the memory cells at a first timing, read data from the memory cells at a second timing later than the first timing, and reads data from the memory cells at a third timing later than the second timing while the first voltage is applied to the word line, calculate a first difference between a number of memory cells based on the data read from the memory cells at the first timing and a number of memory cells based on the data read from the of memory cells at the second timing, a second difference between the number of memory cells based on the data read from the memory cells at the second timing and a number of memory cells based on the data read from the memory cells at the third timing, and a first value obtained by subtracting the first difference from the second difference, and determine, based on the first value, one of the data read from the memory cells at the first timing, the data read from the memory cells at the second timing, and the data read from the memory cells at the third timing as a plurality of pieces of first read data from the memory cells.

Hereinafter, embodiments will be described with reference to the drawings. In the following description, components having the same function and configuration are denoted by the same reference numeral. In addition, in a case where a plurality of components having a common reference sign is distinguished, the common reference sign is added with a suffix for distinction. Note that, in a case where a plurality of components do not need to be particularly distinguished, only the common reference sign is attached to the plurality of components, and no suffixes are attached thereto. Examples of suffixes include a lower case alphabet added to the end of a reference sign and an index meaning an array.

1 First Embodiment

A memory system according to a first embodiment will be described.

1.1 Configuration

A configuration of the memory system according to the first embodiment will be described.

1.1.1 Memory System

An overall configuration of the memory system according to the first embodiment will be described with reference to FIG. 1. FIG. 1 is a block diagram illustrating an example of a configuration of an information processing system including a memory system and a host apparatus according to the first embodiment.

A memory system 1 includes a non-volatile memory 10, a memory controller 20, and a volatile memory 30. For example, the non-volatile memory 10, the memory controller 20, and the volatile memory 30 may be combined to form one semiconductor device. The memory system 1 is, for example, a solid state drive (SSD) or an SD™ card.

The memory system 1 communicates with, for example, an external host apparatus 2. The memory system 1 stores data from the host apparatus 2. In addition, the memory system 1 reads data to the host apparatus 2.

The non-volatile memory 10 is, for example, a semiconductor memory. The non-volatile memory 10 includes a plurality of memory cells. The non-volatile memory 10 stores data in a non-volatile manner. The non-volatile memory 10 is, for example, a NAND flash memory. The non-volatile memory 10 may also be referred to as a memory device 10. The non-volatile memory 10 is coupled to the memory controller 20 by, for example, a NAND bus.

The NAND bus transmits and receives various signals according to a NAND interface via individual signal lines. The various signals include, for example, IO<7:0>, /CE, CLE, ALE, /WE, /RE, and /RB.

The signal IO<7:0> is, for example, a signal having an 8-bit width. The signal IO<7:0> is exchanged between the non-volatile memory 10 and the memory controller 20. The signal IO<7:0> includes an address, a command, and data. The command is a signal for controlling the entire non-volatile memory 10. The data includes read data and write data. The signal /CE is a chip enable signal. The signal /CE is a signal for enabling the non-volatile memory 10. The signal CLE is a command latch enable signal. The signal CLE notifies the non-volatile memory 10 that the signal IO<7:0> transmitted to the non-volatile memory 10 is a command while the signal CLE is at the "H (High)" level. The signal ALE is an address latch enable signal. The signal ALE notifies the non-volatile memory 10 that the signal IO<7:0> transmitted to the non-volatile memory 10 is an address while the signal ALE is at the "H (High)" level. The signal /WE is a write enable signal. The signal /WE instructs the non-volatile memory 10 to capture the signal IO<7:0>. The signal /RE is a read enable signal. The signal /RE instructs the non-volatile memory 10 to output the signal IO<7:0>. The signal /RB is a ready busy signal. The signal /RB indicates whether the non-volatile memory 10 is in a ready state (a state of receiving an instruction from the outside) or a busy state (a state of not receiving an instruction from the outside).

The memory controller 20 includes, for example, an integrated circuit such as a system-on-a-chip (SoC). The memory controller 20 receives a command from the host apparatus 2. The function of each part of the memory controller 20 can be realized by dedicated hardware, a processor that executes a program and firmware, or a combination thereof. The memory controller 20 controls the non-volatile memory 10 based on a command received from the host apparatus 2. Specifically, the memory controller 20 writes data instructed to be written in the non-volatile memory 10 based on a write command received from the host apparatus 2. In addition, based on a read command received from the host apparatus 2, the memory controller 20 reads, from the non-volatile memory 10, data instructed to be read by the host apparatus 2, and transmits the data to the host apparatus 2.

The volatile memory 30 is, for example, a dynamic random access memory (DRAM). The volatile memory 30 stores firmware for managing the non-volatile memory 10 and various types of management information. The volatile memory 30 stores, for example, a predetermined read voltage (default value) for the read process executed in the non-volatile memory 10. Note that the predetermined read voltage can also be stored in the non-volatile memory 10.

1.1.2 Memory Controller

An overall configuration of the memory controller 20 of the memory system 1 according to the first embodiment will be described with continued reference to FIG. 1.

The memory controller 20 includes a processor (central processing unit (CPU)) 21, a built-in memory 22, a buffer memory 23, a host interface circuit (host I/F) 24, a NAND interface circuit (NAND I/F) 25, and an error checking and correcting (ECC) circuit 26.

The processor 21 controls the entire operation of the memory controller 20. The processor 21 issues, for example, a command for instructing the non-volatile memory 10 to execute various processes including a write process, a read process, and an erase process.

The built-in memory 22 is, for example, a semiconductor memory such as a static random access memory (SRAM). The built-in memory 22 is used as a work space of the processor 21. The built-in memory 22 stores firmware for managing the non-volatile memory 10, various management tables, and the like.

The buffer memory 23 is, for example, a semiconductor memory such as a dynamic random access memory (DRAM). The buffer memory 23 temporarily stores write data received from the host apparatus 2, read data received from the non-volatile memory 10 by the memory controller 20, and the like. Note that the buffer memory 23 may be provided outside the memory controller 20.

The host interface circuit 24 is coupled to the host apparatus 2 via a host bus. The host bus is a bus conforming to, for example, peripheral component interconnect express (PCI EXPRESS™ (PCIe)), universal flash storage (UFS), SD™ interface, serial attached small computer system interface (SCSI) (SAS), serial advanced technology attachment (serial ATA (SATA)), or non-volatile memory express (NVM EXPRESS™ (NVMe)). The host interface circuit 24 manages communication between the memory controller 20 and the host apparatus 2. For example, the host interface circuit 24 transfers an instruction and data received from the host apparatus 2 to the processor 21 and the buffer memory 23, respectively.

The NAND interface circuit 25 is coupled to the non-volatile memory 10 via the NAND bus. The NAND bus is a bus conforming to toggle NAND (toggle DDR) or open NAND flash interface (ONFI), for example. The NAND interface circuit 25 manages communication with the non-volatile memory 10. The NAND interface circuit 25 transmits a command, an address, and write data to the non-volatile memory 10 in accordance with an instruction from the processor 21. In addition, the NAND interface circuit 25 receives read data from the non-volatile memory 10.

The ECC circuit 26 performs error correction processing on data stored in the non-volatile memory 10. More specifically, the ECC circuit 26 generates the parity of the error correction code at when data is written and adds the parity of the error correction code to the write data. The error correction code is, for example, a hard-decision decoding code such as a Bose-Chaudhuri-Hocquenghem (BCH) code or a Reed-Solomon (RS) code, or a soft-decision decoding code such as a low-density parity-check (LDPC) code. In addition, the ECC circuit 26 can perform an error correction code decoding process and correct a fail bit during a data reading process.

1.1.3 Non-Volatile Memory

Figure 2:
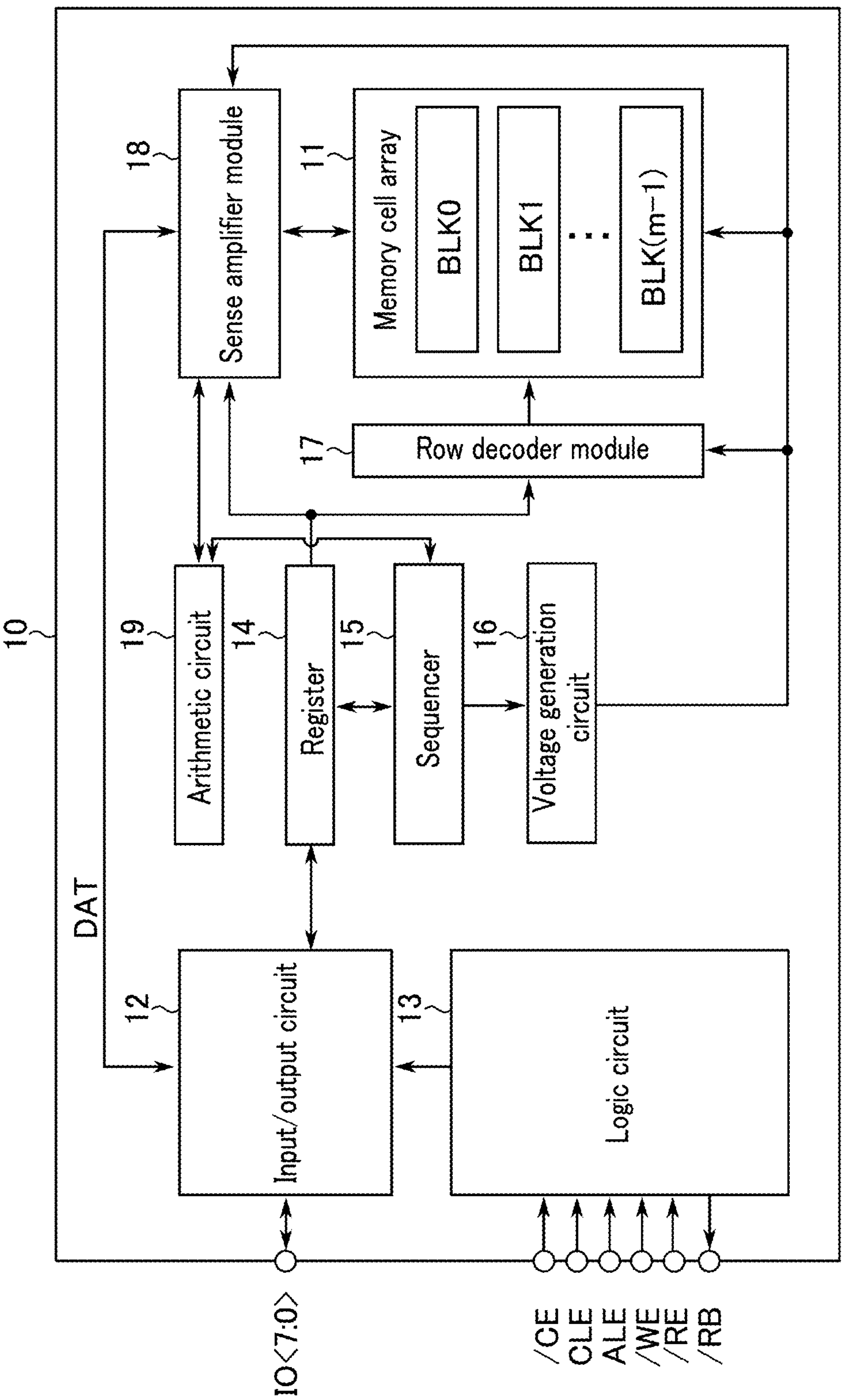
FIG. 2 is a block diagram illustrating an example of a configuration of a non-volatile memory according to the first embodiment.

A configuration the non-volatile memory 10 of the memory system 1 according to the first embodiment will be described with reference to FIG. 2. FIG. 2 is a block diagram illustrating an example of a configuration of a non-volatile memory according to the first embodiment.

The non-volatile memory 10 includes a memory cell array 11, an input/output circuit 12, a logic circuit 13, a register 14, a sequencer 15, a voltage generation circuit 16, a row decoder module 17, a sense amplifier module 18, and an arithmetic circuit 19. Note that some or all of the elements of the register 14, the sequencer 15, the sense amplifier module 18, and the arithmetic circuit 19 can also be referred to as a controller (control circuit).

The memory cell array 11 includes a plurality of blocks BLK0, BLK1, . . . , and BLK (m−1). Note that m is an integer of 2 or more. Each block BLK is a set of a plurality of memory cell transistors capable of storing data in a non-volatile manner. Each block BLK is used, for example, as a data erasing unit. The memory cell array 11 is also provided with a plurality of bit lines and a plurality of word lines. One memory cell transistor is associated with, for example, one bit line and one word line.

The input/output circuit 12 transmits/receives a signal IO<7:0> to/from the memory controller 20. The input/output circuit 12 transfers the command and the address in the signal IO<7:0> to the register 14. In addition, the input/output circuit 12 transmits/receives data DAT in the signal IO<7:0> to/from the sense amplifier module 18. The data DAT includes write data and read data.

The logic circuit 13 receives the signals /CE, CLE, ALE, /WE, and /RE from the memory controller 20. In addition, the logic circuit 13 transfers the signal /RB to the memory controller 20.

The register 14 stores the command and the address. The address includes a row address and a column address. The row address is used to select the block BLK. The column address is used to select the bit line. The register 14 transfers the row address to the row decoder module 17. In addition, the register 14 transfers the column address to the sense amplifier module 18. The register 14 also transfers the command to the sequencer 15.

The sequencer 15 controls the entire non-volatile memory 10 according to a sequence based on the received command.

The voltage generation circuit 16 generates a voltage necessary for operations such as a write process, a read process, and an erase process based on an instruction from the sequencer 15. The voltage generation circuit 16 supplies the generated voltage to the memory cell array 11, the row decoder module 17, and the sense amplifier module 18.

The row decoder module 17 selects the block BLK based on the row address received from the register 14. The voltage is transferred from the voltage generation circuit 16 to the selected block BLK via the row decoder module 17.

The sense amplifier module 18 senses a threshold voltage of a memory cell transistor to be read in the data read process. Then, the sense amplifier module 18 transfers the read data based on the sensing result to the input/output circuit 12. In addition, the sense amplifier module 18 transfers the write data DAT to the memory cell array 11 in the write process.

The arithmetic circuit 19 performs various arithmetic operations using data stored in the sense amplifier module 18 based on an instruction from the sequencer 15, for example. Note that these various arithmetic operations may be executed by the sequencer 15. In this case, the non-volatile memory 10 may not include the arithmetic circuit 19. Further, the arithmetic circuit 19 may be a configuration in the sense amplifier module 18.

1.1.4 Memory Cell Array

Figure 3:
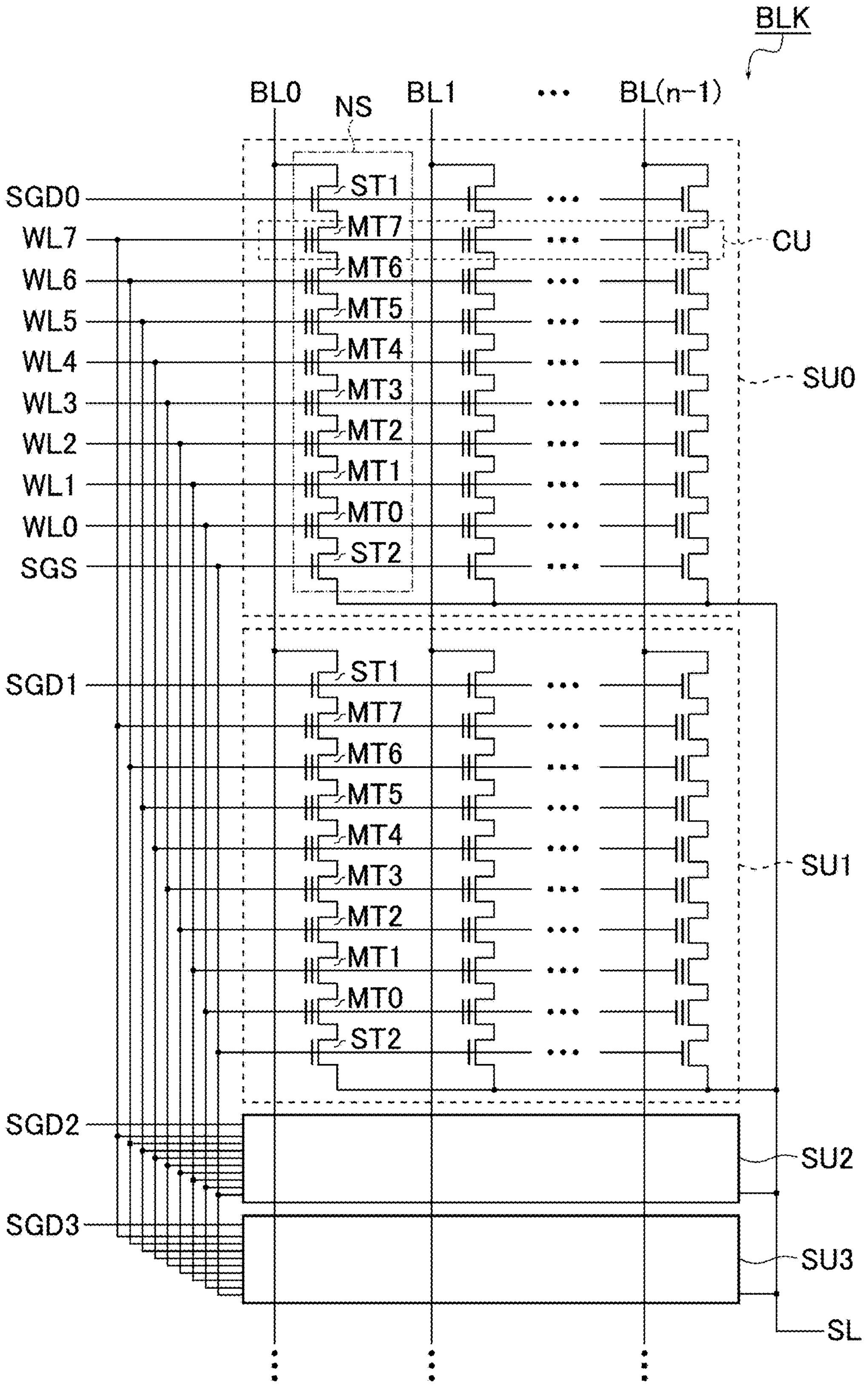
FIG. 3 is a circuit diagram illustrating an example of a circuit configuration of a memory cell array included in the non-volatile memory according to the first embodiment.

A configuration of each block BLK included in the memory cell array 11 in the non-volatile memory 10 will be described with reference to FIG. 3. FIG. 3 is a circuit diagram illustrating an example of a circuit configuration of a memory cell array included in the non-volatile memory according to the first embodiment.

The block BLK includes, for example, four string units SU0, SU1, SU2, and SU3. Hereinafter, when the string units SU0, SU1, SU2, and SU3 are not distinguished, each of the string units SU0, SU1, SU2, and SU3 is simply referred to as a string unit SU. Each string unit SU includes a plurality of NAND strings NS.

Each NAND string NS includes, for example, eight memory cell transistors MT0 to MT7 and select transistors ST1 and ST2. Hereinafter, when the memory cell transistors MT0 to MT7 are not distinguished, each of the memory cell transistors MT0 to MT7 is simply referred to as a memory cell transistor MT. Note that the number of memory cell transistors MT included in each NAND string NS is not limited. Each memory cell transistor MT includes a laminated gate including a control gate and a charge storage layer. The memory cell transistors MT are coupled in series between one end of the select transistor ST1 and one end of the select transistor ST2.

In each block BLK, the gates of the select transistors ST1 of the string units SU0 to SU3 are coupled to select gate lines SGD0 to SGD3, respectively. That is, each select gate line SGD is coupled to only one of the string units SU in the same block BLK. The gates of the select transistors ST2 of all the string units SU in the block BLK are coupled to a select gate line SGS. That is, the select gate line SGS is coupled to all the string units SU in the same block BLK. The control gates of the memory cell transistors MT0 to MT7 in each block BLK are coupled to the word lines WL0 to WL7, respectively. That is, the word lines WL of the same address are coupled to all the string units SU in the same block BLK.

The other end of the select transistor ST1 is coupled to any one of the plurality of bit lines BL0 to BL(n−1). Note that n is an integer of 2 or more. Each bit line BL is coupled to the NAND string NS of the same column in each of the plurality of blocks BLK.

The other end of the select transistor ST2 is coupled to a source line SL. The source line SL is shared among the plurality of blocks BLK, for example.

As described above, for example, the data erasing is collectively performed on the memory cell transistors MT in the same block BLK. On the other hand, the read process and the write process can be collectively performed for the plurality of memory cell transistors MT coupled to any word line WL in any string unit SU of any block BLK. Such a set of memory cell transistors MT sharing the word line WL in one string unit SU is referred to as, for example, a cell unit CU. That is, the cell unit CU is a set of memory cell transistors MT for which the write process or read process is collectively executed. The cell unit CU corresponds to, for example, one or a plurality of sets of storage spaces. The write process or the read process for one cell unit CU is executed for one of the sets of storage spaces. Such a unit of the storage space is referred to as a "page".

1.1.5 Threshold Distribution of Memory Cell Transistors

Figure 4:
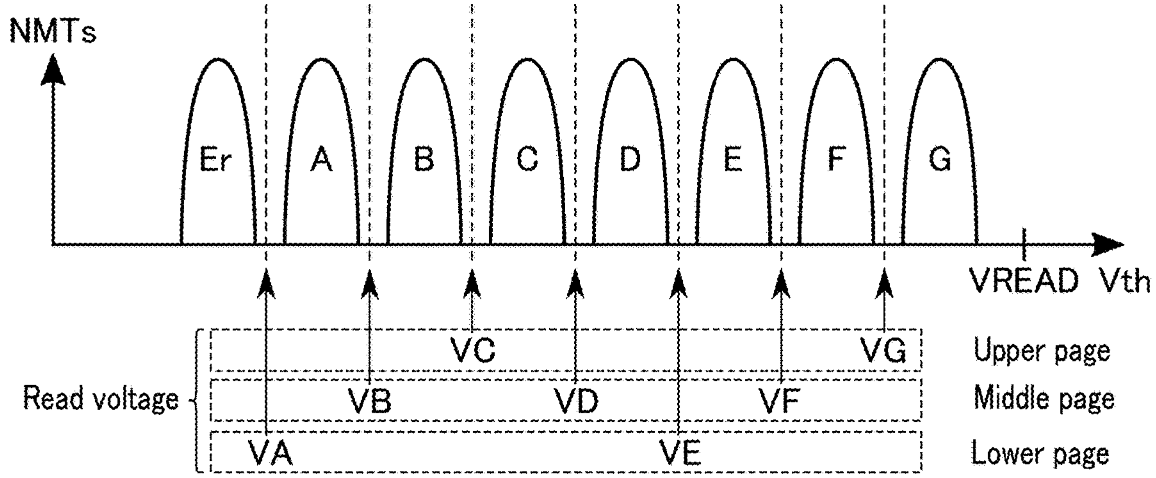
FIG. 4 is a diagram illustrating an example of threshold voltage distribution of the memory cell transistors included in the non-volatile memory according to the first embodiment.

A threshold voltage distribution of the memory cell transistors MT included in the non-volatile memory 10 will be described with reference to FIG. 4. FIG. 4 is a diagram illustrating an example of threshold voltage distribution of the memory cell transistors included in the non-volatile memory according to the first embodiment. In FIG. 4, the vertical axis of the threshold voltage distribution corresponds to the number of memory cell transistors MT, and the horizontal axis corresponds to the threshold voltages of the memory cell transistors MT. In the drawings used below, the number of memory cell transistors MT and the threshold voltage of the memory cell transistor MT are denoted as NMTs and Vth, respectively.

In the non-volatile memory 10 according to the first embodiment, for example, eight states are formed by the threshold voltages of the plurality of memory cell transistors MT. That is, each memory cell transistor MT can have eight states. Hereinafter, the eight states are referred to as an "Er" state, an "A" state, a "B" state, a "C" state, a "D" state, an "E" state, an "F" state, and a "G" state in ascending order of threshold voltage.

The "Er" state corresponds to, for example, a data erase state. The threshold voltage of the memory cell transistor MT that falls within the "Er" state is less than a voltage VA.

The "A" to "G" states correspond to states in which charges are injected into a charge storage layer of the memory cell transistor MT. The threshold voltage of the memory cell transistor MT that falls within the "A" state is equal to or higher than the voltage VA and lower than a voltage VB (VB>VA). The threshold voltage of the memory cell transistor MT that falls within the "B" state is equal to or higher than the voltage VB and lower than a voltage VC (VC>VB). The threshold voltage of the memory cell transistor MT that falls within the "C" state is equal to or higher than the voltage VC and less than a voltage VD (VD>VC). The threshold voltage of the memory cell transistor MT that falls within the "D" state is equal to or higher than the voltage VD and less than a voltage VE (VE>VD). The threshold voltage of the memory cell transistor MT that falls within the "E" state is equal to or higher than the voltage VE and less than a voltage VF (VF>VE). The threshold voltage of the memory cell transistor MT that falls within the "F" state is equal to or higher than the voltage VF and less than a voltage VG (VG>VF). The threshold voltage of the memory cell transistor MT that falls within the "G" state is equal to or higher than the voltage VG and less than a voltage VREAD (VREAD>VG).

When a voltage is applied to the control gate, the memory cell transistor MT is turned on when the memory cell transistor MT has a threshold voltage lower than the applied voltage. When a voltage is applied to the control gate, the memory cell transistor MT is turned off when the memory cell transistor MT has a threshold voltage equal to or higher than the applied voltage. When the voltage VREAD is applied to the control gate of the memory cell transistor MT, the memory cell transistor MT is turned on irrespective which of the "Er" to "G" states the memory cell transistor MT is in.

Three-bit data different from each other is allocated to each of the eight states. Accordingly, each memory cell transistor MT can store 3-bit data. An example of data assignment to the eight states will be listed below. Hereinafter, data allocated to each state is indicated in the order of "upper bit, middle bit, and lower bit" corresponding to the state.

"Er" state: "1, 1, 1" data,
"A" state: "1, 1, 0" data,
"B" state: "1, 0, 0" data,
"C" state: "0, 0, 0" data,
"D" state: "0, 1, 0" data,
"E" state: "0, 1, 1" data,
"F" state: "0, 0, 1" data,
"G" state: "1, 0, 1" data.

In a case where such data allocation is applied, the one-page data (lower page data) formed by the lower bit is determined by read processes each using a corresponding one of the voltages VA and VE. The one-page data (middle page data) formed by the middle bit is determined by read processes each using a corresponding one of the voltages VB, VD, and VF. The one-page data (upper page data) formed by the upper bit is determined by read processes each using a corresponding one of the voltages VC and VG. Hereinafter, each of the voltages VA to VG is also referred to as a read voltage.

1.1.6 Sense Amplifier Module

Figure 5:
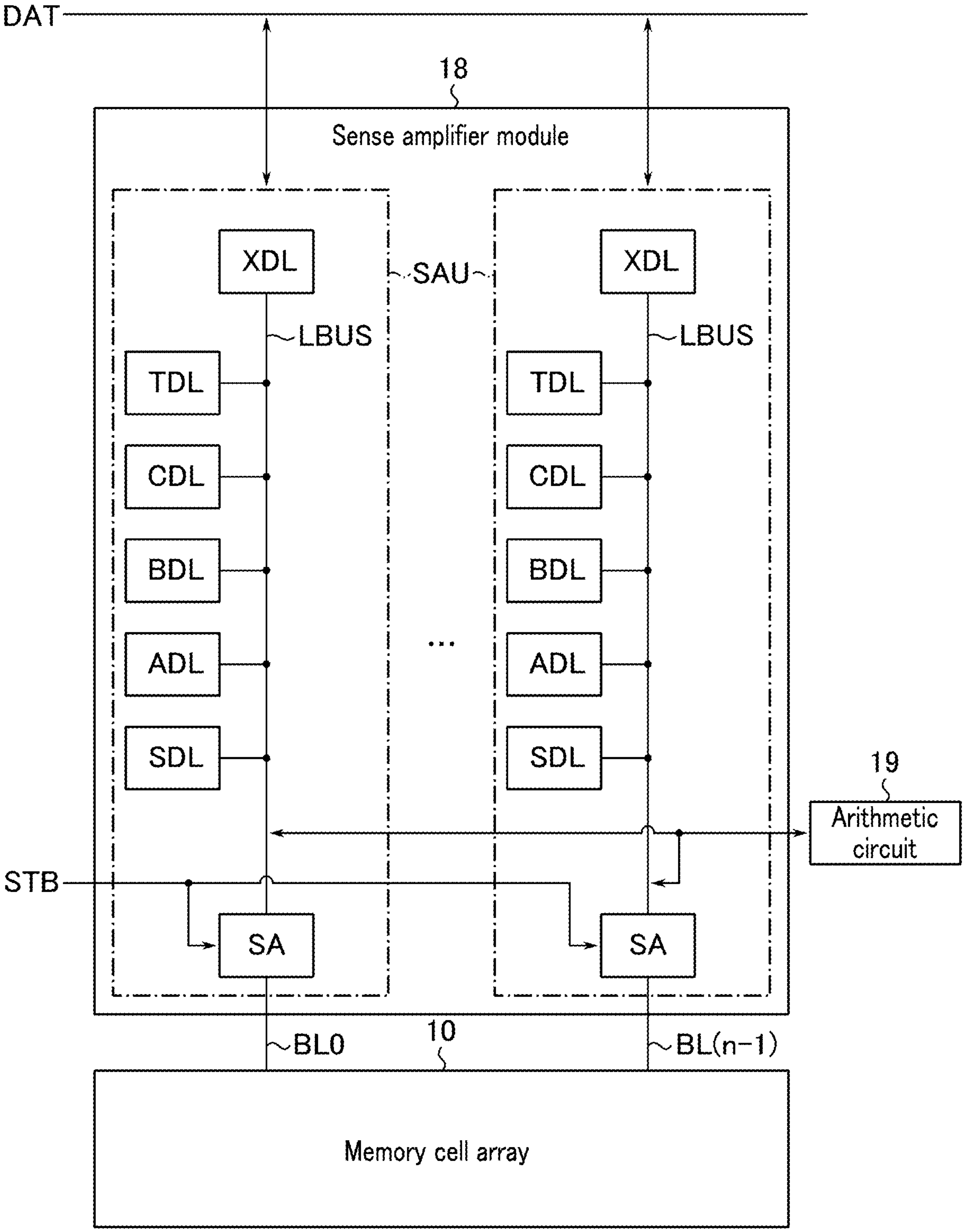
FIG. 5 is a block diagram illustrating an example of a configuration of a sense amplifier module of the non-volatile memory according to the first embodiment.

A configuration of the sense amplifier module 18 in the non-volatile memory 10 will be described with reference to FIG. 5. FIG. 5 is a block diagram illustrating an example of a configuration of a sense amplifier module of the non-volatile memory according to the first embodiment.

The sense amplifier module 18 includes a plurality of sense amplifier units SAU coupled to the plurality of bit lines BL.

Each sense amplifier unit SAU includes, for example, latch circuits SDL, ADL, BDL, CDL, TDL, and XDL, and a sense circuit SA. The latch circuits SDL, ADL, BDL, CDL, TDL, and XDL, and the sense circuit SA are coupled via a bus LBUS. The latch circuits SDL, ADL, BDL, CDL, TDL, and XDL, and the sense circuit SA are coupled via the bus LBUS so that they can exchange data.

The latch circuit XDL is used, for example, for transmission and reception of data DAT between the sense amplifier unit SAU and the input/output circuit 12.

The latch circuits SDL, ADL, BDL, CDL, and TDL temporarily store, for example, write data or read data.

Although not illustrated, the latch circuit SDL includes a first inverter and a second inverter, and a first transistor and a second transistor. The first and second transistors are, for example, N-type metal-oxide-semiconductor field-effect transistors (MOSFETs) having a low withstand voltage. The input node of the first inverter is coupled to a node LAT_S. The output node of the first inverter is coupled to a node INV_S. The input node of the second inverter is coupled to the node INV_S. The output node of the second inverter is coupled to the node LAT_S. One end of the first transistor is coupled to the bus LBUS. The other end of the first transistor is coupled to the node INV_S. One end of the second transistor is coupled to the bus LBUS. The other end of the second transistor is coupled to the node LAT_S. The latch circuit SDL stores data in the node LAT_S. On the other hand, the latch circuit SDL stores the inverted data of the data stored in the node LAT_S in the node INV_S. Since the latch circuits ADL, BDL, CDL, and TDL have the same configuration as the latch circuit SDL, the description of these configurations will be omitted.

In the read process, the sense circuit SA senses the current flowing through the corresponding bit line BL or the voltage of the bit line BL, and determines whether the read data is "0" or "1". Hereinafter, a case where the sense circuit SA senses the current flowing through the bit line BL will be described. The sense amplifier unit SAU determines the read data, for example, at a timing corresponding to a signal STB generated by the sequencer 15. In addition, the sense circuit SA applies a voltage to the bit line BL based on the write data in the write process. Note that, for example, the sense circuit SA controls the bit line BL according to the data stored by the latch circuit SDL.

The bus LBUS of each sense amplifier unit SAU is coupled to, for example, the arithmetic circuit 19. As a result, for example, the arithmetic circuit 19 is configured to be able to perform arithmetic operations using data stored by the latch circuits SDL, ADL, BDL, CDL, and TDL in each sense amplifier unit SAU.

Note that the configuration of the sense amplifier unit SAU is not limited to the above, and various modifications can be made. For example, the number of latch circuits included in the sense amplifier unit SAU can be designed according to the number of bits of data stored by the memory cell transistor MT.

1.1.7 Sense Circuit

Figure 6:
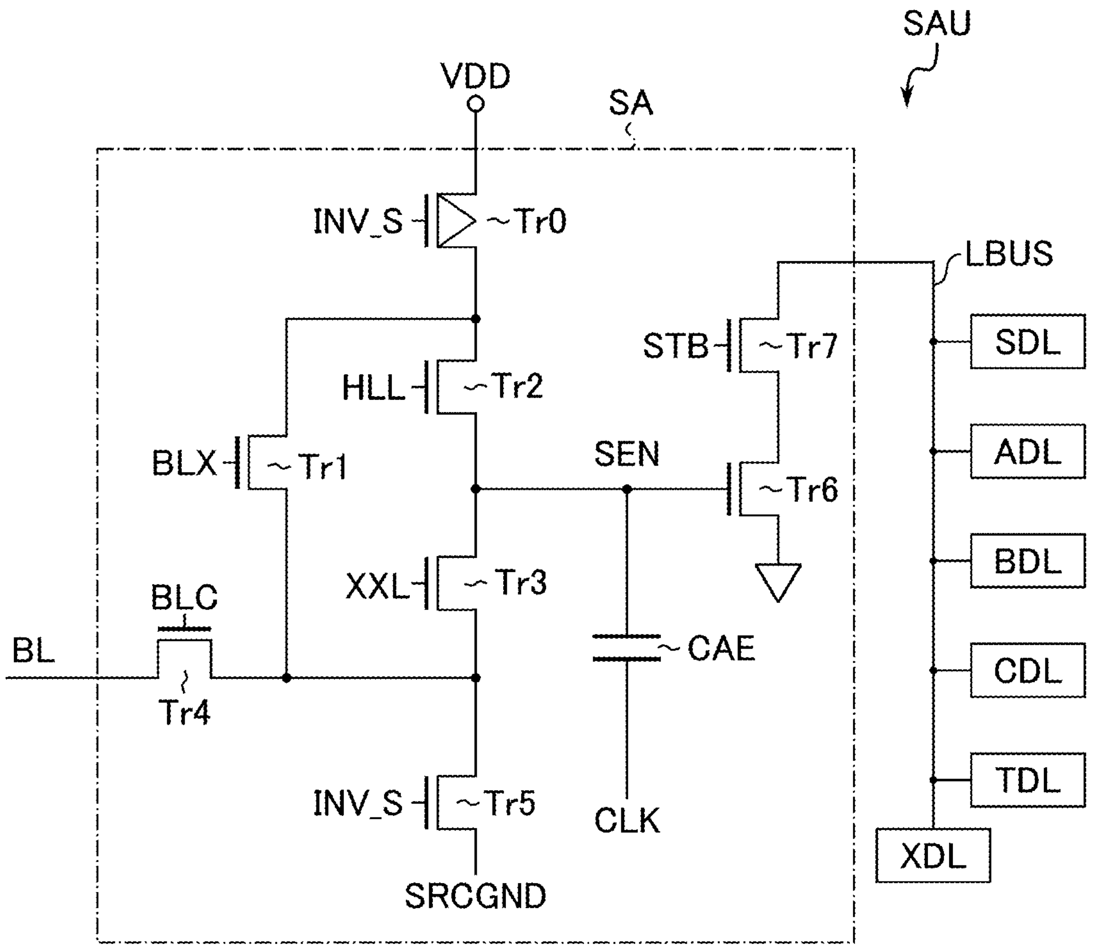
FIG. 6 is a circuit diagram illustrating an example of a circuit configuration of a sense circuit included in the non-volatile memory according to the first embodiment.

An example of a configuration of the sense circuit SA of the sense amplifier unit SAU included in the sense amplifier module 18 will be described with reference to FIG. 6. FIG. 6 is a circuit diagram illustrating an example of a circuit configuration of a sense amplifier circuit included in the non-volatile memory according to the first embodiment. FIG. 6 illustrates a circuit configuration of the sense circuit SA together with other configurations of the sense amplifier unit SAU.

The sense circuit SA includes, for example, transistors Tr0 to Tr7 and a capacitor CAE. The transistor Tr0 is, for example, a P-type MOSFET. The transistors Tr1 to Tr7 are, for example, N-type MOSFETS.

For example, a voltage VDD is applied to the source of the transistor Tr0. The drain of the transistor Tr0 is coupled to the transistors Tr1 and Tr2. The gate of the transistor Tr0 is coupled to, for example, the node INV_S in the latch circuit SDL.

The drain of the transistor Tr1 is coupled to the drain of the transistor Tr0. The source of the transistor Tr1 is coupled to the transistors Tr3, Tr4, and Tr5. A signal BLX is input to the gate of the transistor Tr1.

The drain of the transistor Tr2 is coupled to the drain of the transistor Tr0 and the drain of the transistor Tr1. The source of the transistor Tr2 is coupled to a node SEN. A signal HLL is input to the gate of the transistor Tr2.

The drain of the transistor Tr3 is coupled to the node SEN. The source of the transistor Tr3 is coupled to the source of the transistor Tr1. A signal XXL is input to the gate of the transistor Tr3.

The drain of the transistor Tr4 is coupled to the source of the transistor Tr1 and the source of the transistor Tr3. A signal BLC is input to the gate of the transistor Tr4. The source of the transistor Tr4 is coupled to the corresponding bit line BL. The transistor Tr4 functions as a clamp transistor that clamps the voltage of the bit line BL according to the signal BLC.

The drain of the transistor Tr5 is coupled to the source of the transistor Tr1, the source of the transistor Tr3, and the drain of the transistor Tr4. The source of the transistor Tr5 is coupled to a node SRCGND. For example, a voltage VSS is applied to the node SRCGND. The voltage VSS is ground voltage. The gate of the transistor Tr5 is coupled to, for example, the node INV_S.

The source of the transistor Tr6 is grounded. The gate of the transistor Tr6 is coupled to the node SEN. The transistor Tr6 functions as a sense transistor that senses the voltage of the node SEN.

The drain of the transistor Tr7 is coupled to the bus LBUS. The source of the transistor Tr7 is coupled to the drain of the transistor Tr6. The signal STB is input to the gate of the transistor Tr7.

One electrode of the capacitor CAE is coupled to the node SEN. A clock signal CLK is input to the other electrode of the capacitor CAE.

The signals BLX, HLL, XXL, BLC, and STB and the clock signal CLK are generated by, for example, the sequencer 15.

In the read process, for example, when the node INV_S is set to the "L (Low)" level, the transistor Tr0 is turned on. Furthermore, for example, when the signals BLX and BLC are set to the "H" level, the transistors Tr1 and Tr4 are turned on. As a result, the bit line BL is precharged to a voltage corresponding to the signal BLC via the transistors Tr0, Tr1, and Tr4. Furthermore, for example, when the signal HLL is set to the "H" level, the transistor Tr2 is turned on. As a result, the node SEN is precharged to the voltage VDD.

Then, for example, after the transistor Tr2 is changed from the on-state to the off-state by the signal HLL being changed from the "H" level to the "L" level, the transistor Tr3 is turned on by the signal XXL being changed to the "H" level. When the memory cell transistor MT to be read is in the on-state, a current flows from the bit line BL to the source line SL, so that the voltage of the node SEN decreases. When the voltage at the node SEN becomes lower than a threshold voltage of the transistor Tr6, the transistor Tr6 is turned off. On the other hand, when the memory cell transistor MT to be read is in the off-state, no current flows from the bit line BL to the source line SL, so that the voltage at the node SEN is maintained substantially equal. In addition, the transistor Tr6 is turned on. Hereinafter, the memory cell transistor MT to be read is also referred to as a selected memory cell transistor MT. In addition, hereinafter, the memory cell transistors MT not to be read are also referred to as unselected memory cell transistors MT. In addition, hereinafter, the selected memory cell transistor MT to be turned on is also referred to as an on-cell. In addition, hereinafter, the selected memory cell transistor MT to be turned off is also referred to as an off-cell.

Then, for example, when the signal STB is changed from the "L" level to the "H" level, the transistor Tr7 is changed from the off-state to the on-state. As a result, voltages corresponding to the on-state and the off-state of the transistor Tr6 are transferred to the bus LBUS. In a case where the transistor Tr6 is turned off, the bus LBUS is set to the "H" level. In a case where the transistor Tr6 is turned on, the bus LBUS is set to the "L" level. When the bus LBUS is at the "H" level, the sense amplifier unit SAU stores "1" data in the latch circuit SDL, for example. When the bus LBUS is at the "L" level, the sense amplifier unit SAU stores "0" data in the latch circuit SDL, for example. The data stored in the latch circuit SDL is transferred to, for example, the latch circuit ADL, BDL, CDL, or TDL. For the sake of conciseness in the following description, such a process of transferring data to the latch circuit SDL and then to the latch circuit ADL, BDL, CDL, or TDL may also be simply mentioned as a process of transferring data to the latch circuit ADL, BDL, CDL, or TDL. Note also that the sense circuit SA may directly transfer data to the latch circuit ADL, BDL, CDL, or TDL.

Also, the foregoing description has assumed an example where "1" data is stored in the latch circuit SDL if the memory cell transistor MT is in the on-state and "0" data is stored in the latch circuit SDL if the memory cell transistor MT is in the off-state, but no limitation is intended by this. It is also possible to store "0" data in the latch circuit SDL if the memory cell transistor MT is in the on-state and store "1" data in the latch circuit SDL if the memory cell transistor MT is in the off-state. Likewise, for also the latch circuits ADL, BDL, CDL, and TDL, the relationship between data ("0" data or "1" data) in each of these latch circuits and the state (on-state or off-state) of the memory cell transistor MT is not limited to one specific relationship. It is possible to store either "1" data or "0" data in the latch circuit if the memory cell transistor MT is in the on-state and store either "0" data or "1" data in the latch circuit if the memory cell transistor MT is in the off-state. Further, the sense circuit SA may invert data by logical negation operation (NOT operation) at the transfer of the data from the latch circuit SDL to the latch circuit ADL, BDL, CDL, or TDL. In this case, the relationship between the "0" data or the "1" data in the latch circuit SDL and the on-state or the off-state of the memory cell transistor MT differs from the relationship between the "0" data or the "1" data in each of the latch circuits ADL, BDL, CDL, and TDL and the on-state or the off-state of the memory cell transistor MT.

1.2 Operation

An operation of the memory system 1 according to the first embodiment will be described. A tracking operation executed in the non-volatile memory 10 will be described below.

1.2.1 Outline of Tracking Operation

Figure 7:
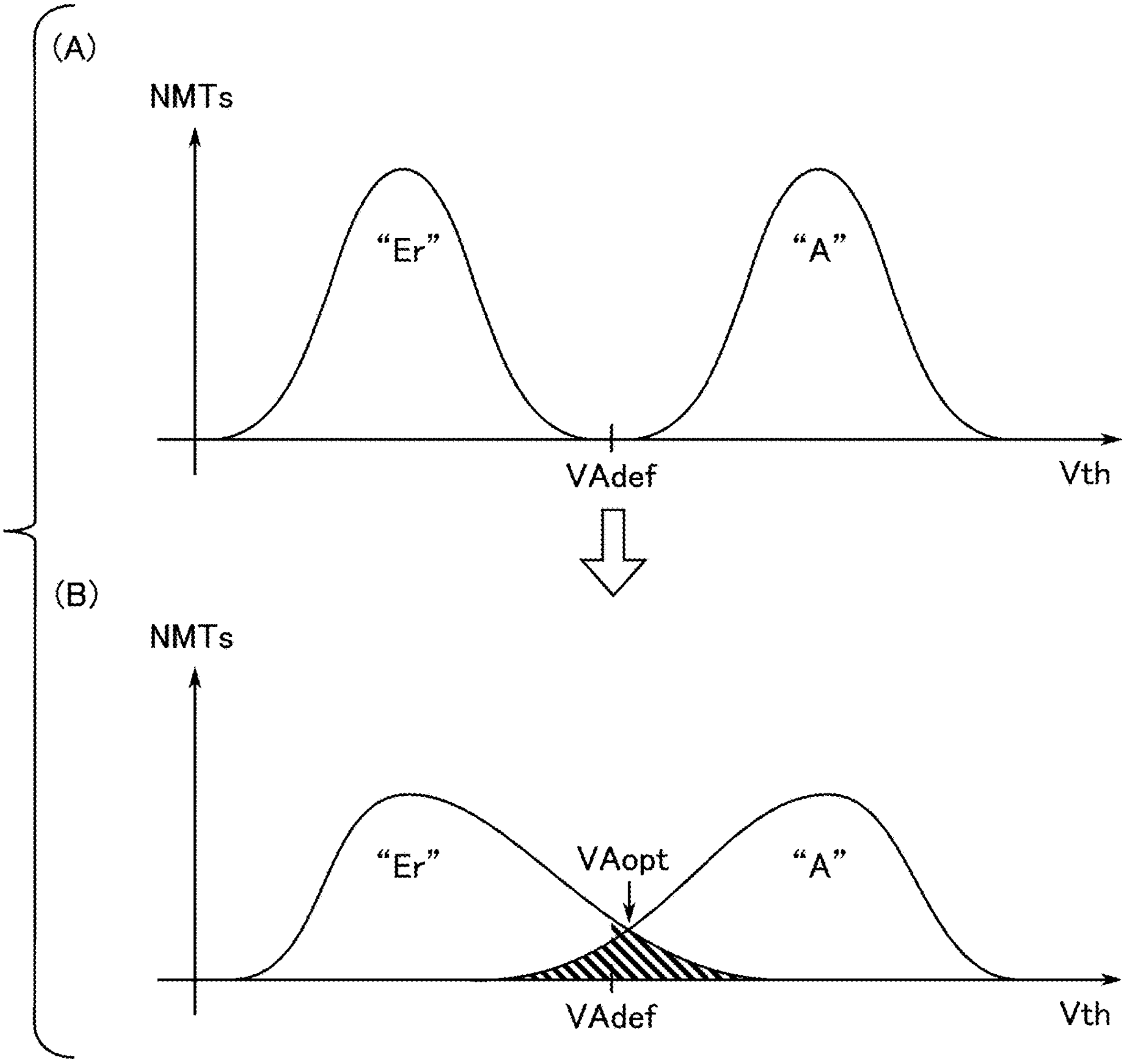
FIG. 7 is a diagram for describing an outline of the tracking operation executed in the non-volatile memory according to the first embodiment.

An outline of the tracking operation executed in the non-volatile memory 10 according to the first embodiment will be described with reference to FIG. 7. FIG. 7 is a diagram for describing an outline of the tracking operation executed in the non-volatile memory according to the first embodiment. In FIG. 7, only the "Er" state and the "A" state are illustrated in order to simplify the description.

The tracking operation is executed, for example, when it is assumed that data cannot be correctly read with a predetermined read voltage. In the following description, when the predetermined read voltage is indicated, "def" is added to the end of each of the read voltages VA to VG. Furthermore, the read voltage is also simply referred to as a read voltage Vdef.

As illustrated in FIG. 7(A), immediately after the writing, the threshold voltage distributions in the "Er" state and the "A" state are separated from each other. Therefore, correct data can be read by using a predetermined read voltage VAdef between the "Er" state and the "A" state as the read voltage VA.

However, the threshold voltage of a memory cell transistor MT can fluctuate due to various factors. For example, charges injected into the charge storage layer of a memory cell transistor MT may come out of the charge storage layer as time passes. As a result, the threshold voltage of the memory cell transistor MT may decrease. Further, for example, when the read process is repeatedly executed for a certain cell unit CU, as described later, the voltage VREAD is repeatedly applied to the gate of the memory cell transistor MT of another cell unit CU adjacent to the cell unit CU. As a result, the threshold voltage of the memory cell transistor MT may increase. That is, disturbance may occur. As a result, the distribution width of threshold voltage in each state may increase, or the mode value of the threshold voltage distribution in each state may change. As a result, as illustrated in FIG. 7(B), adjacent distributions may overlap each other. In a case where adjacent distributions overlap each other, when the read process is performed with the read voltage VAdef, data different from that at the time of writing is read from a memory cell transistor MT corresponding to the hatched part in FIG. 7(B). More specifically, for the "Er" state in the threshold voltage distribution, the read data of a memory cell transistor MT having a threshold voltage equal to or higher than the read voltage VAdef is a fail bit. More specifically, for the "A" state in the threshold voltage distribution, the read data of a memory cell transistor MT having a threshold voltage lower than the read voltage VAdef is a fail bit. In a case where the number of fail bits exceeds the number of error correctable bits of the ECC circuit 26, the data cannot be correctly corrected.

In such a case, the number of fail bits can be reduced by using read data at an optimum read voltage shifted from the read voltage Vdef by a certain voltage. In FIG. 7(B), the optimum read voltage is indicated as a read voltage VAopt.

In the first embodiment, the tracking operation is, for example, an operation of determining the optimum read voltage by the read process, and determining the data of the upper, middle, or lower page stored in the cell unit CU based on the read data at the determined optimum read voltage.

1.2.2 Overall Operation

Figure 8:
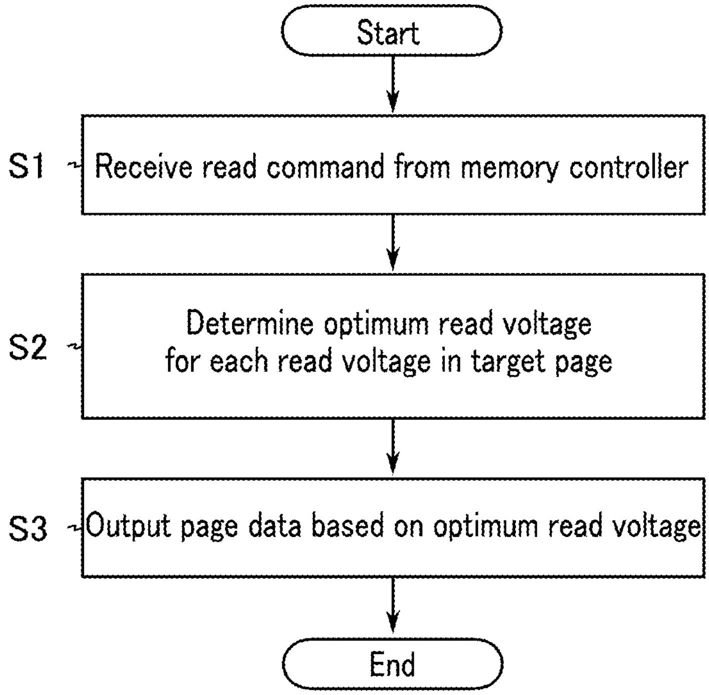
FIG. 8 is a flowchart for explaining the tracking operation in the non-volatile memory according to the first embodiment.

An overall operation of the tracking operation of the memory system 1 according to the first embodiment will be described with reference to FIG. 8. FIG. 8 is a flowchart for explaining the tracking operation in the non-volatile memory according to the first embodiment. Note that, in the following, an example of a case where the tracking operation for the lower page is executed will be described, but the present invention is not limited thereto. The same applies to a case where the tracking operation for the upper page or the tracking operation for the middle page is executed.

The non-volatile memory 10 receives, from the memory controller 20, a read command for instructing the non-volatile memory 10 to execute a read process (S1).

When the read command is received as described above, the non-volatile memory 10 determines, for example, the optimum read voltage for each read voltage in a page (target page) to be tracked (S2). That is, an optimum read voltage determining process is executed. The optimum read voltage determining process will be described later.

Further, the non-volatile memory 10 determines the page data stored in the cell unit CU based on the read data at each of the determined optimum read voltages.

Then, the non-volatile memory 10 outputs the determined page data to the memory controller 20 (S3).

1.2.3 Optimum Read Data Determining Process

Figure 9:
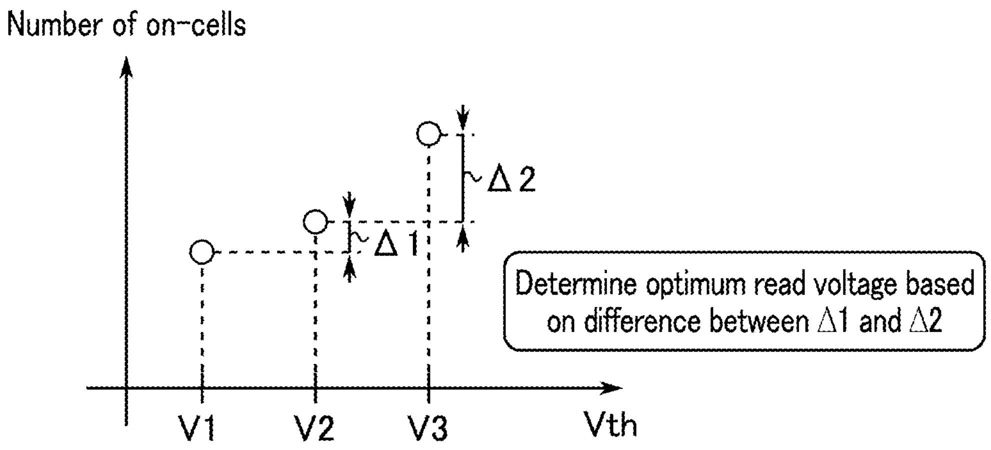
FIG. 9 is a diagram for describing an outline of the optimum read voltage determining process performed in the tracking operation in the non-volatile memory according to the first embodiment.

An outline of the optimum read voltage determining process performed in the tracking operation in the non-volatile memory 10 according to the first embodiment will be described with reference to FIG. 9. FIG. 9 is a diagram for describing an outline of the optimum read voltage determining process performed in the tracking operation in the non-volatile memory according to the first embodiment.

In the optimum read voltage determining process, the non-volatile memory 10 executes the read process in the target page. In the read process, for each read voltage, the read data is read at a reference read voltage, at a read voltage obtained by subtracting a predetermined voltage from the reference read voltage, and at a read voltage obtained by adding a predetermined voltage to the reference read voltage. The reference read voltage is, for example, the read voltage Vdef. This read process will be described later.

In the following, for each read voltage, "2" is added to the end of the read voltage as the reference read voltage. Furthermore, the read voltage is also simply referred to as a read voltage V2. For each read voltage, "1" is added to the end of the read voltage as a read voltage (V2−ΔV) obtained by subtracting a predetermined voltage (ΔV) from the read voltage V2. This read voltage is also simply referred to as a read voltage V1. For each read voltage, "3" is added to the end of the read voltage as a read voltage (V2+ΔV) obtained by adding a predetermined voltage to the read voltage V2. This read voltage is also simply referred to as a read voltage V3.

In addition, based on the read results, the arithmetic circuit 19 executes an arithmetic operation related to the number of on-cells when the read process is executed using each of the read voltages V1, V2, and V3. Hereinafter, the number of on-cells when the read process is executed using each read voltage is also simply referred to as the number of on-cells at the corresponding read voltage.

In the arithmetic operation related to the number of on-cells, the arithmetic circuit 19 calculates a difference Δ1 between the number of on-cells at the read voltage V1 and the number of on-cells at the read voltage V2, and a difference Δ2 between the number of on-cells at the read voltage V2 and the number of on-cells at the read voltage V3.

As described later, the arithmetic circuit 19 determines the optimum read voltage from the read voltages V1, V2, and V3 based on the calculated differences Δ1 and Δ2.

1.2.4 Flowchart of Optimum Read Data Determining Process

Figure 10:
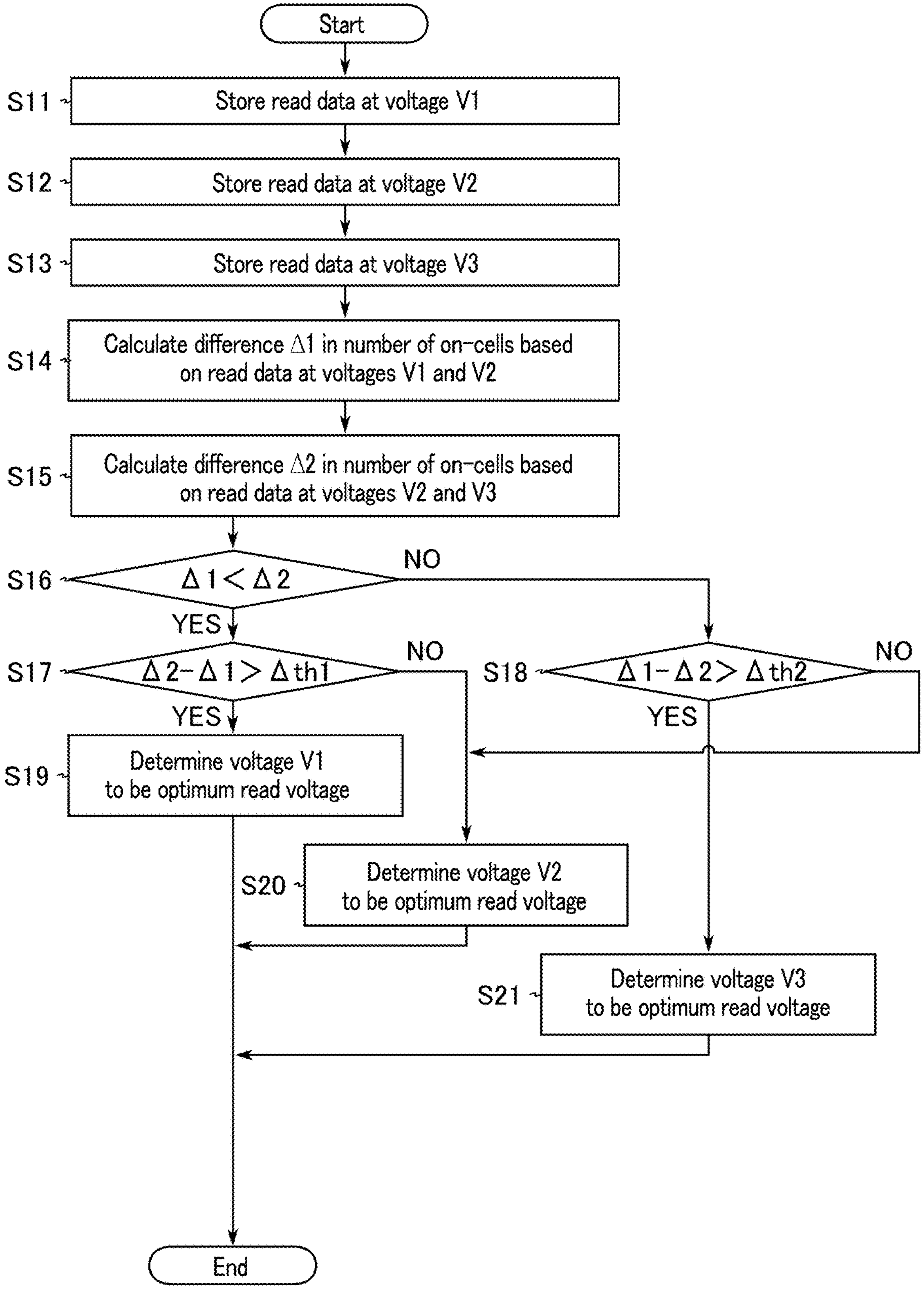
FIG. 10 is a flowchart for describing the optimum read voltage determining process performed in the tracking operation in the non-volatile memory according to the first embodiment.

The optimum read voltage determining process performed in the tracking operation in the non-volatile memory 10 according to the first embodiment will be further described with reference to FIG. 10. FIG. 10 is a flowchart for describing the optimum read voltage determining process performed in the tracking operation in the non-volatile memory according to the first embodiment. Hereinafter, a flowchart for one read voltage of the read voltages related to the target page will be described.

In the optimum read voltage determining process, each sense amplifier unit SAU performs a read process to store the read data at the read voltage V1 for the selected memory cell transistor MT corresponding to that sense amplifier unit SAU in, for example, the latch circuit ADL (S11). Then, the process proceeds to S12.

Further, each sense amplifier unit SAU performs a read process to store the read data at the read voltage V2 for the selected memory cell transistor MT corresponding to that sense amplifier unit SAU in, for example, the latch circuit BDL (S12). Then, the process proceeds to S13.

Each sense amplifier unit SAU also performs a read process to store the read data at the voltage V3 for the selected memory cell transistor MT corresponding to that sense amplifier unit SAU in, for example, the latch circuit CDL (S13). Then, the process proceeds to S14.

The arithmetic circuit 19 calculates the difference Δ1 based on the read data stored in the latch circuit ADL and the read data stored in the latch circuit BDL (S14). For example, the arithmetic circuit 19 calculates the difference Δ1 based on an exclusive OR operation (XOR operation) of the two pieces of read data stored in the latch circuits ADL and BDL in each sense amplifier unit SAU. More specifically, for example, the arithmetic circuit 19 calculates the difference Δ1 by counting the number of bits that are "1" data among the data obtained by the exclusive OR operation in each of the plurality of sense amplifier units SAU. Then, the process proceeds to S15. Note that the flowchart of FIG. 10 illustrates an example in which the difference Δ1 is calculated after the read data at the voltage V3 is stored in the latch circuit CDL, but the present invention is not limited thereto. The arithmetic circuit 19 may calculate the difference Δ1 after the pieces of read data at the read voltages V1 and V2 are stored in the latch circuits ADL and BDL, respectively, and before the read data at the voltage V3 is stored in the latch circuit CDL.

The arithmetic circuit 19 also calculates the difference Δ2 based on the read data stored in the latch circuit BDL and the read data stored in the latch circuit CDL (S15). For example, the arithmetic circuit 19 calculates the difference Δ2 based on an exclusive OR operation of two pieces of read data stored in the latch circuits BDL and CDL in each sense amplifier unit SAU. More specifically, for example, the arithmetic circuit 19 calculates the difference Δ2 by counting the number of bits that are "1" data among the data obtained by the exclusive OR operation in each of the plurality of sense amplifier units SAU. Then, the process proceeds to S16.

The arithmetic circuit 19 determines whether the difference Δ2 is larger than the difference Δ1 (Δ1<Δ2) (S16). In the process of S16, the arithmetic circuit 19 calculates, for example, a value (Δ2−Δ1) obtained by subtracting the difference Δ1 from the difference Δ2.

Then, the arithmetic circuit 19 makes the above determination based on the value (Δ2−Δ1). That is, the arithmetic circuit 19 determines whether the value (Δ2−Δ1) is larger than zero. The value (Δ2−Δ1) can be referred to as a value of second differentiation of the number of on-cells at the read voltage V2. When the difference Δ2 is larger than the difference Δ1 (S16; YES), the process proceeds to S17. When the difference Δ2 is equal to or smaller than the difference Δ1 (S16; NO), the process proceeds to S18.

When the difference Δ2 is larger than the difference Δ1 (S16; YES), the arithmetic circuit 19 determines whether the value (Δ2−Δ1) is larger than a value Δth1 ((Δ2−Δ1)>Δth1) (S17). The value Δth1 is a positive value. The value Δth1 may be set according to the read voltage V2. Also, the value Δth1 may be set to a value differing according to the voltages VA to VG. When the value (Δ2−Δ1) is larger than the value Δth1 (S17; YES), the process proceeds to S19. When the value (Δ2−Δ1) is smaller than or equal to the value Δth1 (S17; NO), the process proceeds to S20.

When the difference Δ2 is equal to or smaller than the difference Δ1 (S16; NO), the arithmetic circuit 19 determines whether the value (Δ1−Δ2) (−(Δ2−Δ1)) obtained by subtracting the difference Δ2 from the difference Δ1 is larger than a value Δth2 ((Δ1−Δ2)>Δth2) (S18). The value Δth2 is a positive value. The value Δth2 is, for example, a value equivalent to the value Δth1. The value Δth2 may be set according to the read voltage V2. Also, the value Δth2 may be set to a value differing according to the voltages VA to VG. The value Δth2 may be a value different from the value Δth1. When the value (Δ1−Δ2) is larger than the value Δth2 (S18; YES), the process proceeds to S21. When the value (Δ1−Δ2) is less than or equal to the value Δth2 (S18; NO), the process proceeds to S20.

When the value (Δ2−Δ1) is larger than the value Δth1 (S17; YES), the arithmetic circuit 19 determines that the read voltage V1 is the optimum read voltage. Then, the process ends.

When the value (Δ2−Δ1) is smaller than or equal to the value Δth1 (S17; NO), and when the value (Δ1−Δ2) is smaller than or equal to the value Δth2 (S18; NO), the arithmetic circuit 19 determines that the read voltage V2 is the optimum read voltage. That is, when the value (Δ2−Δ1) is smaller than or equal to the value Δth1 and larger than or equal to the value (−Δth2) ($-\Delta th2 \leq (\Delta 2 - \Delta 1) \leq \Delta th1$), the arithmetic circuit 19 determines that the read voltage V2 is the optimum read voltage. Then, the process ends.

When the value (Δ1−Δ2) is larger than the value Δth2 (S18; YES), the arithmetic circuit 19 determines that the voltage V3 is the optimum read voltage. Then, the process ends.

The optimum read voltage is determined for each read voltage in the above manner.

In the optimum read voltage determining process, the optimum read voltage is sequentially determined for each of the plurality of read voltages of the target page. Then, for example, the arithmetic circuit 19 specifies the corresponding read data for each of the plurality of read voltages and determines the page data.

Note that, in determining the page data, for the read voltage determined first among the plurality of read voltages of the target page, for example, the sense amplifier unit SAU stores the read data at the optimum read voltage among the pieces of read data stored in the latch circuits ADL, BDL, and CDL in the latch circuit TDL. For the second and subsequent read voltages determined among the plurality of read voltages of the target page, for example, the arithmetic circuit 19 performs an exclusive NOR operation (XNOR operation) of the read data at the optimum read voltage among the pieces of read data stored in the latch circuits ADL, BDL, and CDL, and the data stored in the latch circuit TDL. Then, the sense amplifier unit SAU stores the result of the XNOR operation in the latch circuit TDL. Further, the result of the XNOR operation of the read data at the optimum read voltage determined last among the plurality of read voltages of the target page and the data stored in the latch circuit TDL is determined as the data. Hereinafter, the data stored in the latch circuit TDL is also referred to as data based on the read data at the optimum read voltage.

1.2.5 Read Process

The read process executed in the optimum read voltage determining process will be described. In the read process, pieces of read data for a plurality of read voltages in the target page are sequentially read.

1.2.5.1 Sense Operation

Figure 11:
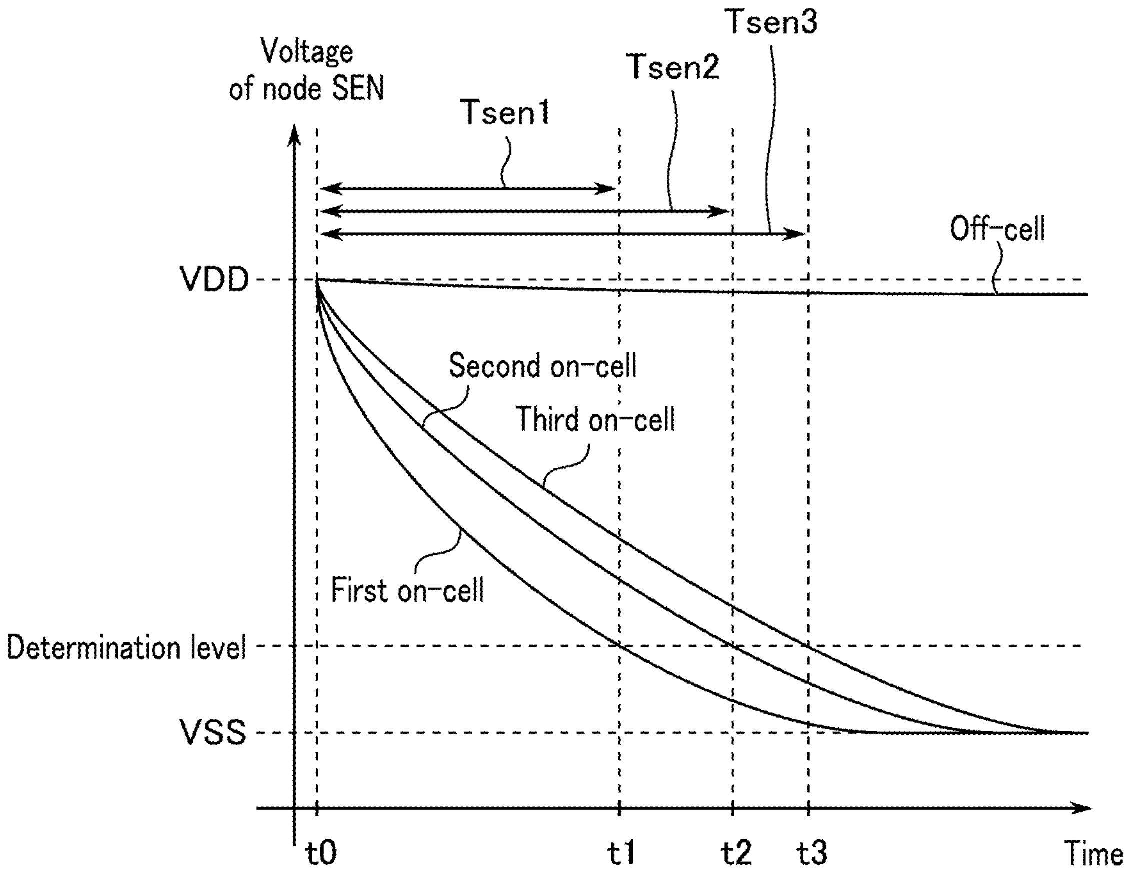
FIG. 11 is a timing chart for explaining the sense operation in the read process at the time the optimum read voltage determining process is executed in the non-volatile memory according to the first embodiment.

The sense operation in the read process executed in the optimum read voltage determining process will be described with reference to FIG. 11. FIG. 11 is a timing chart for explaining the sense operation in the read process at the time the optimum read voltage determining process is executed in the non-volatile memory according to the first embodiment. The vertical axis in FIG. 11 is the voltage of the node SEN corresponding to the memory cell transistor MT to be read.

The sense operation is an operation of determining whether or not the threshold voltage Vth of the memory cell transistor MT has reached a criterion level in the read process.

When the charge of the node SEN is transferred to the bit line BL during a sense period, the voltage of the node SEN decreases. At this time, the rate at which the voltage of the node SEN decreases differs according to the threshold voltage Vth of the memory cell transistor MT. For example, the memory cell transistor MT with a threshold voltage Vth equal to or lower than a read voltage VL ($Vth \leq VL$) shifts to a strong on-state. As a result, the voltage of the node SEN rapidly decreases. Hereinafter, a memory cell transistor MT that has shifted to the on-state and has a threshold voltage Vth equal to or lower than the read voltage VL is also referred to as a first on-cell. In addition, for example, a memory cell transistor MT with a threshold voltage Vth higher than the read voltage VL and equal to or lower than a voltage VM ($VL < Vth \leq VM$) is in a weaker on-state than the first on-cell. As a result, the voltage of the node SEN gradually decreases as compared with the first on-cell. Hereinafter, a memory cell transistor MT that has shifted to a weaker on-state than the first on-cell and has a threshold voltage Vth higher than the read voltage VL and equal to or lower than the voltage VM is also referred to as a second on-cell. In addition, for example, a memory cell transistor MT with a threshold voltage Vth higher than the voltage VM and equal to or lower than a read voltage VH ($VM < Vth \leq VH$) shifts to a weaker on-state than the second on-cell. As a result, the voltage of the node SEN gradually decreases as compared with the second on-cell. Hereinafter, a memory cell transistor MT that has shifted to the on-state and has a threshold voltage Vth higher than the voltage VM and equal to or lower than the read voltage VH is also referred to as a third on-cell. In addition, for example, a memory cell transistor MT with a threshold voltage Vth higher than the read voltage VH ($VH < Vth$) shifts to the off-state. As a result, the voltage of the node SEN hardly decreases. Hereinafter, a memory cell transistor MT that has shifted to the off-state and has a threshold voltage Vth higher than the read voltage VH is also referred to as an off-cell.

A sense period Tsen1 for sensing whether the threshold voltage Vth is equal to or lower than the read voltage VL is set based on the above relationships. The length of the sense period Tsen1 is set such that the voltage of the node SEN corresponding to the memory cell transistor MT whose threshold voltage Vth is equal to or lower than the read voltage VL falls below the criterion level, and the voltage of the node SEN corresponding to the memory cell transistor MT whose threshold voltage Vth is higher than the read voltage VL exceeds the criterion level. The sense period Tsen1 is a period from time to when the charge of the node SEN starts to be transferred to the bit line BL to time t1.

At the end of the sense period Tsen1, the sense amplifier module 18 determines whether the voltage of the node SEN is below the criterion level. This makes it possible to determine whether the threshold voltage Vth of the memory cell transistor MT is equal to or lower than the read voltage VL.

In addition, a sense period Tsen2 for sensing whether the threshold voltage Vth is equal to or lower than the read voltage VM is set. The length of the sense period Tsen2 is set such that the voltage of the node SEN corresponding to the memory cell transistor MT whose threshold voltage Vth is equal to or lower than the voltage VM falls below the criterion level, and the voltage of the node SEN corresponding to the memory cell transistor MT whose threshold voltage Vth is higher than the voltage VM exceeds the criterion level. The sense period Tsen2 is a period from time t0 to time t2. Time t2 is a time after time t1.

At the end of the sense period Tsen2, the sense amplifier module 18 determines whether the voltage of the node SEN is below the criterion level. This makes it possible to determine whether the threshold voltage Vth of the memory cell transistor MT is equal to or lower than the voltage VM.

In addition, a sense period Tsen3 for sensing whether the threshold voltage Vth is equal to or lower than the read voltage VH is set. The length of the sense period Tsen3 is set such that the voltage of the node SEN corresponding to the memory cell transistor MT whose threshold voltage Vth is equal to or lower than the read voltage VH falls below the criterion level, and the voltage of the node SEN corresponding to the memory cell transistor MT whose threshold voltage Vth is higher than the read voltage VH exceeds the criterion level. The sense period Tsen3 is a period from time t0 to time t3. Time t3 is a time after time t2.

At the end of the sense period Tsen3, the sense amplifier module 18 determines whether the voltage of the node SEN is below the criterion level. This makes it possible to determine whether the threshold voltage Vth of the memory cell transistor MT is equal to or lower than the read voltage VH.

In the first embodiment, in the read process, for example, the voltage V2 is applied to the word line WL. In addition, the read voltages VL, VM, and VH are the read voltages V1, V2, and V3, respectively. It is determined whether the threshold voltage Vth of the memory cell transistor MT is equal to or less than the read voltage V1, whether the threshold voltage Vth of the memory cell transistor MT is equal to or less than the read voltage V2, and whether the threshold voltage Vth of the memory cell transistor MT is equal to or less than the read voltage V1.

1.2.5.2 Timing Chart of Read Process

Figure 12:
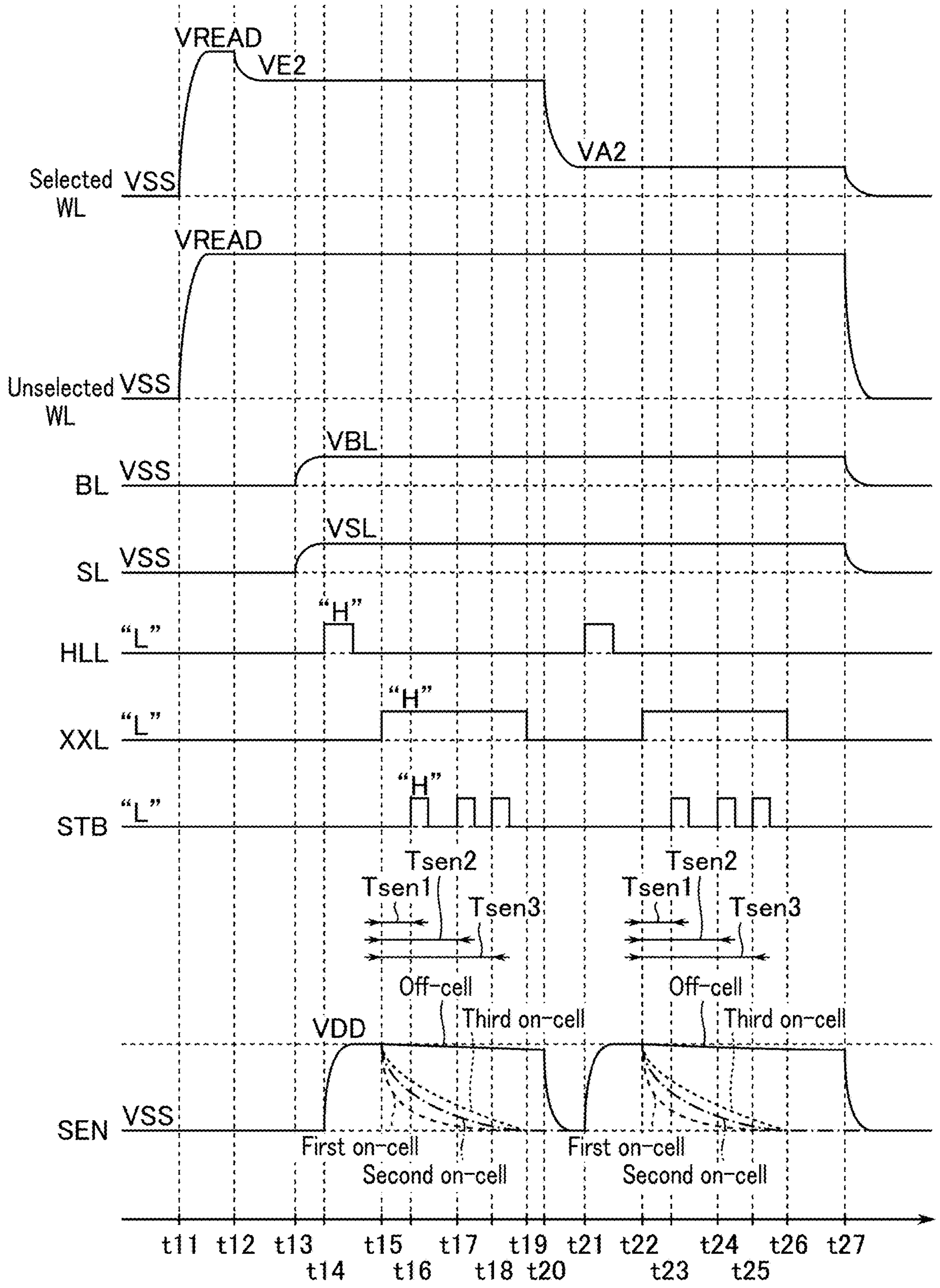
FIG. 12 is a timing chart for explaining the read process during the optimum read voltage determining process in the non-volatile memory according to the first embodiment.

The voltage of each wiring at the time of the read process will be described with reference to FIG. 12. FIG. 12 is a timing chart for explaining the read process during the optimum read voltage determining process in the non-volatile memory according to the first embodiment. FIG. 12 illustrates a timing chart in a case where the target page is the lower page. Hereinafter, the word line WL corresponding to the selected memory cell transistor MT is referred to as a selected word line WL. A word line WL corresponding to an unselected memory cell transistor MT is referred to as an unselected word line WL.

At time t11, the row decoder module 17 applies the voltage VREAD to the selected word line WL and the unselected word line WL.

At time t12, the row decoder module 17 applies a voltage VE2 to the selected word line WL.

At time t13, the sense amplifier module 18 applies a voltage VBL to the bit line BL. That is, the bit line BL is precharged. In addition, the voltage generation circuit 16 applies a voltage VSL to the source line SL.

At time t14, the sequencer 15 changes the signal HLL from the "L" level to the "H" level and turns on the transistor Tr2. As a result, the voltage VDD is precharged to the node SEN in the sense amplifier unit SAU.

At time t15, the sequencer 15 changes the signal XXL from the "L" level to the "H" level to turn on the transistor Tr3. Then, in the sense period Tsen1 from time t15 to time t16, it is determined whether the threshold voltage Vth is equal to or lower than the read voltage V1. More specifically, in a case where the threshold voltage of the selected memory cell transistor MT is higher than the read voltage V1 and equal to or lower than the voltage V2 (in a case of the second on-cell), in a case where the threshold voltage of the selected memory cell transistor MT is higher than the voltage V2 and equal to or lower than the read voltage V3 (in a case of the third on-cell), and in a case where the threshold voltage of the selected memory cell transistor MT is higher than the read voltage V3 (in a case of the off-cell), the voltage of the node SEN is maintained at the voltage of the "H" level that turns on the transistor Tr6 at the time t16. When the threshold voltage of the selected memory cell transistor MT is equal to or lower than the read voltage V1 (if the selected memory cell transistor MT is the first on-cell), the voltage at the node SEN decreases to the voltage at the "L" level that turns off the transistor Tr6 at time t16.

At time t16, the sequencer 15 changes the voltage of the signal STB from the "L" level to the "H" level. Then, the sequencer 15 maintains the signal STB at the voltage of the "H" level for a predetermined period. This turns on the transistor Tr7 in the sense amplifier unit SAU. As a result, when the transistor Tr6 is in the off-state, the voltage of the bus LBUS is set to the "H" level. On the other hand, when the transistor Tr6 is in the on-state, the voltage of the bus LBUS is set to the "L" level. When the bus LBUS is at the "H" level, "1" data is stored in the latch circuit ADL. When the bus LBUS is at the "L" level, "0" data is stored in the latch circuit ADL. That is, the storage of the read data in S11 is performed.

In the sense period Tsen2 from time t15 to time t17, it is determined whether the threshold voltage Vth is equal to or less than the voltage V2. More specifically, in a case where the threshold voltage of the selected memory cell transistor MT is higher than the voltage V2 and equal to or lower than the read voltage V3 (in a case of the third on-cell), and in a case where the threshold voltage of the selected memory cell transistor MT is higher than the read voltage V3 (in a case of the off-cell), the voltage of the node SEN is maintained at the voltage of the "H" level that turns on the transistor Tr6 at the time t17. Further, in a case where the threshold voltage of the selected memory cell transistor MT is equal to or lower than the read voltage V1 (if the selected memory cell transistor MT is the first on-cell), and in a case where the threshold voltage is higher than the read voltage V1 and equal to or lower than the voltage V2 (if the selected memory cell transistor MT is the second on-cell), the voltage at the node SEN decreases to the voltage at the "L" level that turns off the transistor Tr6 at time t17.

At time t17, the sequencer 15 changes the voltage of the signal STB from the "L" level to the "H" level. Then, the sequencer 15 maintains the signal STB at the voltage of the "H" level for a predetermined period. As a result, when the transistor Tr6 is in the off-state, the voltage of the bus LBUS is set to the "H" level. On the other hand, when the transistor Tr6 is in the on-state, the voltage of the bus LBUS is set to the "L" level. When the bus LBUS is at the "H" level, "1" data is stored in the latch circuit BDL. When the bus LBUS is at the "L" level, "0" data is stored in the latch circuit BDL. That is, the storage of the read data in S12 is performed.

In the sense period Tsen3 from time t15 to time t18, it is determined whether the threshold voltage Vth is equal to or lower than the read voltage V3. More specifically, when the threshold voltage of the selected memory cell transistor MT is higher than the read voltage V3 (if the selected memory cell transistor MT is an off-cell), the voltage of the node SEN is maintained at the voltage of the "H" level that turns on the transistor Tr6 at time t18. In addition, in a case where the threshold voltage of the selected memory cell transistor MT is equal to or lower than the read voltage V1 (in a case of the first on-cell), in a case where the threshold voltage is higher than the read voltage V1 and equal to or lower than the voltage V2 (in a case of the second on-cell), and in a case where the threshold voltage is higher than the voltage V2 and equal to or lower than the read voltage V3 (in a case of the third on-cell), the voltage of the node SEN decreases to the voltage of the "L" level that turns off the transistor Tr6 at time t18.

At time t18, the sequencer 15 changes the voltage of the signal STB from the "L" level to the "H" level. Then, the sequencer 15 maintains the signal STB at the voltage of the "H" level for a predetermined period. As a result, when the transistor Tr6 is in the off-state, the voltage of the bus LBUS is set to the "H" level. On the other hand, when the transistor Tr6 is in the on-state, the voltage of the bus LBUS is set to the "L" level. When the bus LBUS is at the "H" level, "1" data is stored in the latch circuit CDL. When the bus LBUS is at the "L" level, "0" data is stored in the latch circuit CDL. That is, the storage of the read data in S13 is performed.

At time t19, the sequencer 15 changes the signal XXL from the "H" level to the "L" level to turn off the transistor Tr3.

As described above, the read data at read voltages VE1, VE2, and VE3 is acquired.

Note that the calculation of the difference Δ1 (processing of S14), the calculation of the difference Δ2 (processing of S15), and the storage of the data based on the read data at the optimum read voltage in the latch circuit TDL are executed, for example, before the time (time t23) at which the read data at the next read voltage V1 (voltage VA1) is stored in the latch circuit ADL.

At time t20, the row decoder module 17 applies a voltage VA2 to the selected word line WL. In addition, the voltage of the node SEN is set as the voltage VSS.

The operation from time t21 to time t26 is substantially the same as the operation from time t14 to time t19 except that read data at the read voltages VA1, VA2, and VA3 is acquired instead of the read data at the read voltages VE1, VE2, and VE3, respectively.

At time t27, the row decoder module 17 applies the voltage VSS to the selected word line WL and the unselected word line WL. In addition, the sense amplifier module 18 applies the voltage VSS to the bit line BL. The voltage generation circuit 16 applies the voltage VSS to the source line SL. In addition, the voltage of the node SEN is set as the voltage VSS.

The read process for the read voltages VE and VA is executed in the above manner.

1.3 Advantageous Effect

According to the first embodiment, the reading speed of the non-volatile memory 10 can be improved. Effects of the first embodiment will be described.

The non-volatile memory 10 according to the first embodiment includes a memory cell array 11, an input/output circuit 12, a logic circuit 13, a register 14, a sequencer 15, a voltage generation circuit 16, a row decoder module 17, a sense amplifier module 18, and an arithmetic circuit 19. In the read process in the tracking operation, the sense amplifier module 18 senses whether the threshold voltage of the memory cell transistor MT is equal to or less than the voltage V1, whether the threshold voltage of the memory cell transistor MT is equal to or less than the voltage V2, and whether the threshold voltage of the memory cell transistor MT is equal to or less than the voltage V3. Based on the sensing results, the arithmetic circuit 19 calculates a difference Δ1 between the number of memory cell transistors MT whose threshold voltage falls within the range of the voltage V1 or less and the number of memory cell transistors MT whose threshold voltage falls within the range of the voltage V2 or less, and a difference Δ2 between the number of memory cell transistors MT whose threshold voltage falls within the range of the voltage V2 or less and the number of memory cell transistors whose threshold voltage falls within the range of the voltage V3 or less. In addition, the arithmetic circuit 19 determines the optimum read voltage based on the value (Δ2−Δ1). Then, the arithmetic circuit 19 determines the data based on the optimum read voltage. With the above configuration, when data is read from the non-volatile memory 10, the reading speed can be improved while ensuring accuracy.

To supplement, when determining the optimum read voltage, the non-volatile memory selects, for example, two read voltages predicted to be the optimum read voltages from three or more optimum read voltage options. When one of the two selected read voltages is set to the optimum read voltage, the non-volatile memory may use the lower or higher read voltage as the optimum read voltage. In this case, whether the lower or higher read voltage is selected from the two selected read voltages is set in advance. However, in this case, the accuracy of the read process may decrease when the one of the two read voltages that leads to a larger number of fail bits used as the optimum read voltage.

In order to improve the accuracy of the read process, the non-volatile memory further searches for an optimum read voltage by, for example, estimation by interpolation of a threshold voltage distribution between the two selected read voltages. However, in this case, there is a problem that the read speed decreases by executing the operation for further search and the read process (re-reading) using the determined optimum read voltage.

According to the first embodiment, the non-volatile memory 10 determines one of the read voltages V1, V2, and V3 as the optimum read voltage based on the difference between the difference Δ1 in the number of on-cells between the read voltages V1 and V2 and the difference Δ2 in the number of on-cells between the read voltages V2 and V3. In other words, the non-volatile memory 10 can determine a read voltage close to the true optimum read voltage among the read voltages V1, V2, and V3 as the optimum read voltage. As a result, the non-volatile memory 10 according to the first embodiment can suppress a delay due to the search for the optimum read voltage and suppress a decrease in the accuracy of the read process. Therefore, the non-volatile memory 10 according to the first embodiment can improve the reading speed.

According to the first embodiment, when determining the optimum read voltage for each read voltage, the non-volatile memory 10 senses the threshold voltage Vth of the memory cell transistor MT in the plurality of different sense periods Tsen1, Tsen2, and Tsen3 while maintaining the voltage applied to the selected word line WL at the read voltage V2. This makes it possible to acquire data equivalent to the read data acquired when a read process is executed by applying different read voltages V1, V2, and V3 to the selected word line WL. This also allows the non-volatile memory 10 according to the first embodiment to improve the reading speed.

2 Modifications of First Embodiment

Modifications of the first embodiment will be described.

2.1 First Modification of First Embodiment

In the first modification of the first embodiment, in addition to the difference between the differences Δ1 and Δ2, the optimum read voltage can be determined based on the difference between the number of on-cells at a read voltage obtained by adding a predetermined voltage to the read voltage V3 and the number of on-cells at the read voltage V3. The configuration of the memory system according to the first modification of the first embodiment is equivalent to the configuration of the memory system according to the first embodiment. In the following, the operation of the memory system according to the first modification of the first embodiment will be mainly described with respect to points different from the configuration and the operation of the memory system according to the first embodiment.

2.1.1 Optimum Read Data Determining Process

Figure 13:
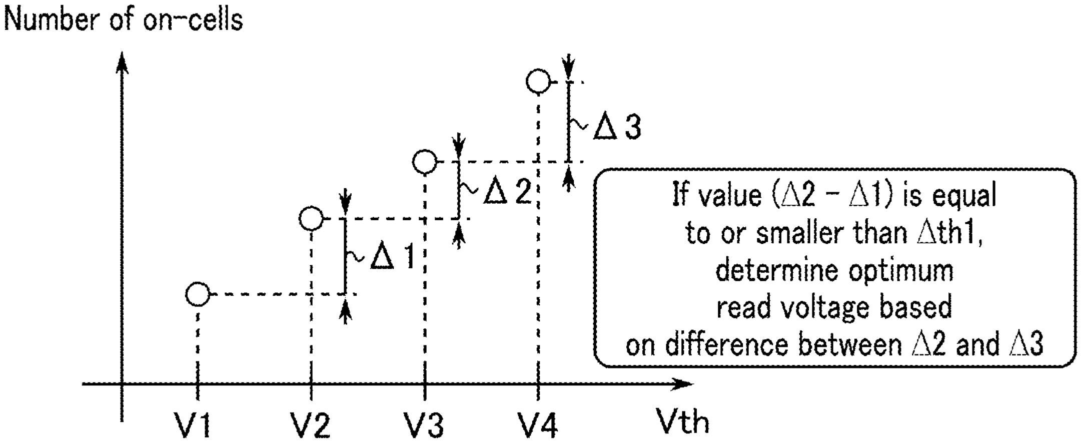
FIG. 13 is a diagram for describing an outline of the optimum read voltage determining process performed in the tracking operation in the non-volatile memory according to the first modification of the first embodiment.

An outline of the optimum read voltage determining process performed in the tracking operation in the non-volatile memory 10 according to the first embodiment will be described with reference to FIG. 13. FIG. 13 is a diagram for describing an outline of the optimum read voltage determining process performed in the tracking operation in the non-volatile memory according to the first modification of the first embodiment.

In the optimum read voltage determining process, when the value (Δ2−Δ1) is smaller than the value Δth1, based on the read process, the arithmetic circuit 19 calculates a difference Δ3 between the number of on-cells at the read voltage obtained by adding a predetermined voltage to the read voltage V3 and the number of on-cells at the read voltage V3. In this case, the arithmetic circuit 19 determines the optimum read voltage based on the differences Δ2 and Δ3. Hereinafter, "4" is added to the end of the read voltage as the read voltage (V3+ΔV) obtained by adding a predetermined voltage to the read voltage V3. This read voltage is also simply referred to as a read voltage V4.

2.1.2 Flowchart of Optimum Read Data Determining Process

Figure 14:
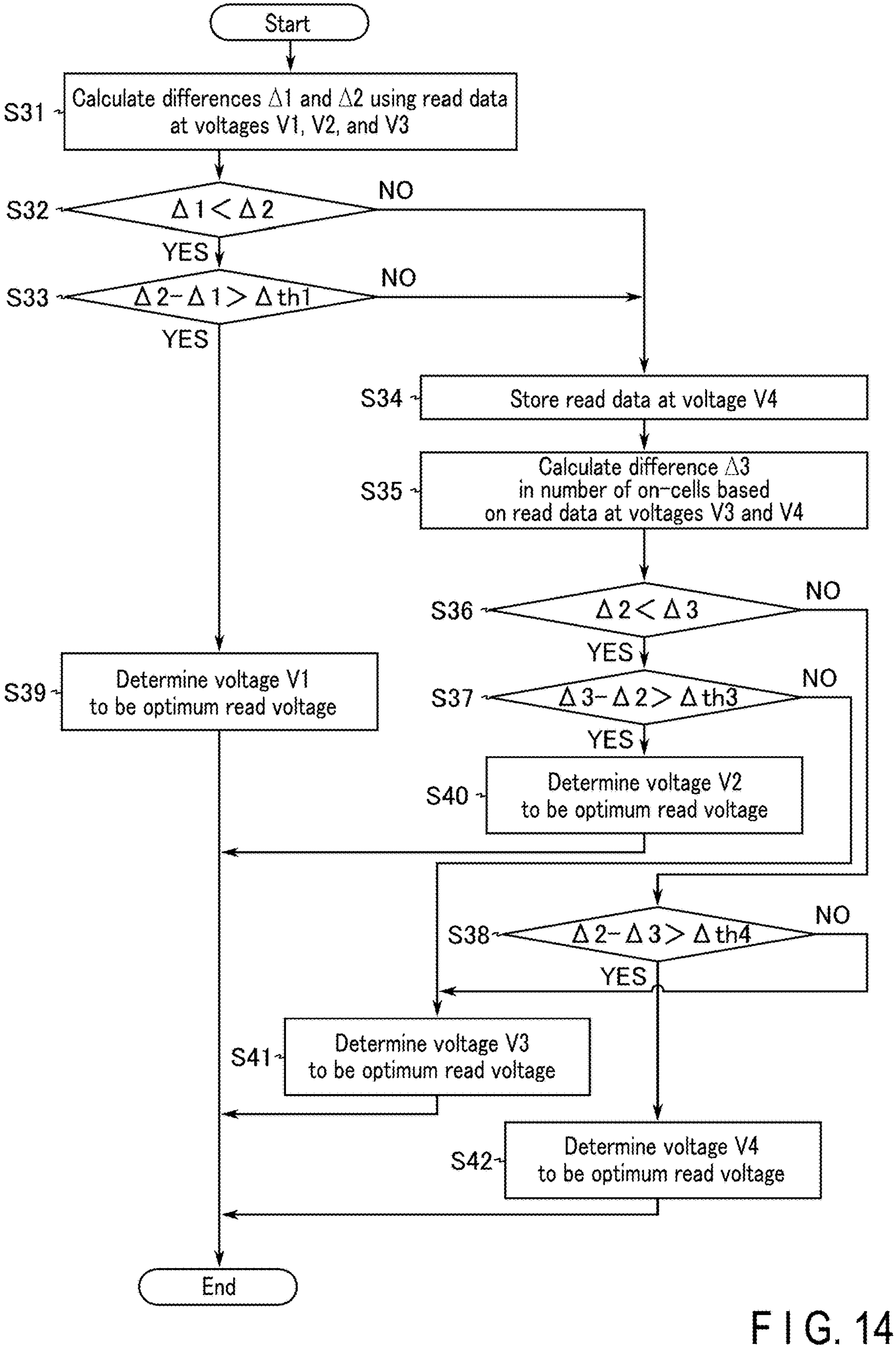
FIG. 14 is a flowchart for describing the optimum read voltage determining process performed in the tracking operation in the non-volatile memory according to the first modification of the first embodiment.

The optimum read voltage determining process performed in the tracking operation in the non-volatile memory 10 according to the first modification of the first embodiment will be further described with reference to FIG. 14. FIG. 14 is a flowchart for describing the optimum read voltage determining process performed in the tracking operation in the non-volatile memory according to the first modification of the first embodiment. Hereinafter, a flowchart for one read voltage of the read voltages related to the target page will be described.

The non-volatile memory 10 stores the pieces of read data at the read voltages V1 to V3 and calculates the differences Δ1 and Δ2 by processing similar to S11 to S15 of the first embodiment (S31).

The arithmetic circuit 19 also determines whether the difference Δ2 is larger than the difference Δ1 (Δ1<Δ2) by processing similar to S16 (S32). When the difference Δ2 is larger than the difference Δ1 (S32; YES), the process proceeds to S33. When the difference Δ2 is equal to or smaller than the difference Δ1 (S32; NO), the process proceeds to S34.

When the difference Δ2 is larger than the difference Δ1 (S32; YES), the arithmetic circuit 19 determines whether the value (Δ2−Δ1) is larger than the value Δth1 ((Δ2−Δ1)>Δth1) by processing similar to S17 (S33). When the value (Δ2−Δ1) is larger than the value Δth1 (S33; YES), the process proceeds to S39. When the value (Δ2−Δ1) is smaller than or equal to the value Δth1 (S33; NO), the process proceeds to S34.

In a case where the difference Δ2 is smaller than or equal to the difference Δ1 (S32; NO), and in a case where the value (Δ2−Δ1) is smaller than or equal to the value Δth1 (S33; NO), each sense amplifier unit SAU performs the read process to store the read data at the read voltage V4 for the selected memory cell transistor MT corresponding to the sense amplifier unit SAU in, for example, the latch circuit ADL (S34). That is, in a case where the value (Δ2−Δ1) is smaller than or equal to the value Δth1, the process of S34 is executed. In the process of S34, the sense amplifier unit SAU uses the latch circuits ADL, BDL, and CDL like a ring buffer as described above. The acquisition of the read data at the read voltage V4 will be described later. Then, the process proceeds to S35.

After that, the arithmetic circuit 19 calculates the difference Δ3 based on the read data stored in the latch circuit ADL and the read data stored in the latch circuit CDL (S35). The difference Δ3 is calculated, for example, based on an exclusive OR operation (XOR operation) of the two pieces of read data stored in the latch circuits ADL and CDL in each sense amplifier unit SAU. Then, the process proceeds to S36.

The arithmetic circuit 19 also determines whether the difference Δ3 is larger than the difference Δ2 (Δ2<Δ3) (S36). In the process of S36, the arithmetic circuit 19 calculates, for example, the value (Δ3−Δ2) obtained by subtracting the difference Δ2 from the difference Δ3. Then, the arithmetic circuit 19 makes the above determination based on the value (Δ3−Δ2). That is, the arithmetic circuit 19 determines whether the value (Δ3−Δ2) is larger than zero. The value (Δ3−Δ2) can be referred to as a value of second differentiation of the number of ON-cells at the read voltage V3. When the difference Δ3 is larger than the difference Δ2 (S36; YES), the process proceeds to S37. When the difference Δ3 is equal to or smaller than the difference Δ2 (S36; NO), the process proceeds to S38.

When the difference Δ3 is larger than the difference Δ2 (S36; YES), the arithmetic circuit 19 determines whether the value (Δ3−Δ2) is larger than the value Δth3 ((Δ3−Δ2)>Δth3) (S37). Δth3 is a positive value. The value Δth3 may be set according to the read voltage. Δth3 is, for example, equivalent to Δth1. When the value (Δ3−Δ2) is larger than the value Δth3 (S37; YES), the process proceeds to S40. When the value (Δ3−Δ2) is smaller than or equal to the value Δth3 (S37; NO), the process proceeds to S41.

In a case where the difference Δ3 is smaller than or equal to the difference Δ2 (S36; NO), the arithmetic circuit 19 determines whether the value (Δ2−Δ3) (−(Δ3−Δ2)) obtained by subtracting the difference Δ3 from the difference Δ2 is larger than the value Δth4 ((Δ2−Δ3)>Δth4) (S38). Δth4 is a positive value. Δth4 is, for example, equivalent to Δth2. The value Δth4 may be set according to the read voltage. When the value (Δ2−Δ3) is larger than the value Δth4 (S38; YES), the process proceeds to S42. When the value (Δ2−Δ3) is less than or equal to the value Δth4 (S38; NO), the process proceeds to S41.

When the value (Δ2−Δ1) is larger than the value Δth1 (S33; YES), the arithmetic circuit 19 determines that the read voltage V1 is the optimum read voltage (S39). Then, the process ends.

When the value (Δ3−Δ2) is larger than the value Δth3 (S37; YES), the arithmetic circuit 19 determines the voltage V2 to be the optimum read voltage (S40). Then, the process ends.

When the value (Δ3−Δ2) is smaller than or equal to the value Δth3 (S37; NO), and when the value (Δ2−Δ3) is smaller than or equal to the value Δth4 (S38; NO), the arithmetic circuit 19 determines the read voltage V3 to be the optimum read voltage (S41). That is, when the value (Δ3−Δ2) is equal to or smaller than the value Δth3 and equal to or larger than the value (−Δth4) (−Δth4≤(Δ3−Δ2)≤Δth3), the arithmetic circuit 19 determines the read voltage V3 as the optimum read voltage. Then, the process ends.

When the value (Δ2−Δ3) is larger than the value Δth4 (S38; YES), the arithmetic circuit 19 determines the read voltage V4 to be the optimum read voltage (S42). Then, the process ends.

The optimum read voltage is determined for each read voltage in the above manner.

The acquisition of the read data at the read voltage V4 will now be described.

In the read process in the tracking operation according to the first modification of the first embodiment, a sense period Tsen4 for sensing whether the threshold voltage Vth is equal to or lower than the read voltage V4 is set. The length of the sense period Tsen4 is set such that the voltage of the node SEN corresponding to the memory cell transistor MT whose threshold voltage Vth is equal to or lower than the voltage V4 falls below the criterion level, and the voltage of the node SEN corresponding to the memory cell transistor MT whose threshold voltage Vth is higher than the voltage V4 exceeds the criterion level. The sense period Tsen4 is a period from time t0 to a time after time t3 in FIG. 11. Further, in this case, a memory cell transistor MT with a threshold voltage Vth higher than the read voltage V4 is set as an off-cell.

Although a timing chart for explaining the read process in the optimum read voltage determining process in the non-volatile memory according to the first modification of the first embodiment is not shown, the non-volatile memory 10 executes determination as to whether the difference Δ2 is larger than the difference Δ1 (S32) and determination as to whether the value (Δ2−Δ1) is larger than the value Δth1 (S33) after the sequencer 15 has changed the signal XXL from the "L" level to the "H" level (after a time corresponding to the time t15 and time t22 of the first embodiment) and before the sense period Tsen4 elapses. When the difference Δ2 is equal to or smaller than the difference Δ1 (S32; NO) and when the value (Δ2−Δ1) is equal to or smaller than the value Δth1 (S33; NO), at the timing when the sense period Tsen4 has elapsed, the read data at the read voltage V4 is stored in the latch circuit ADL, similarly to the read data at the read voltage V1 in the first embodiment.

The same effects as those of the first embodiment are also provided by the first modification of the first embodiment.

In addition, according to the first modification of the first embodiment, instead of determining the optimum read voltage from the read voltages V1, V2, and V3, the optimum read voltage is determined from the read voltages V1, V2, V3, and V4, so that the accuracy of the read process can be improved.

2.2 Second Modification of First Embodiment

In the second modification of the first embodiment, in the read process, shift reading is executed instead of setting the sense periods Tsen1, Tsen2, and Tsen3.

The configuration of the memory system according to the second modification of the first embodiment is equivalent to the configuration of the memory system according to the first embodiment. In the following, the operation of the memory system according to the second modification of the first embodiment will be mainly described with respect to points different from the configuration and the operation of the memory system according to the first embodiment.

In the second modification of the first embodiment, the shift read operation is a read process using the read voltages V1 and V3 obtained by shifting a predetermined read voltage V2 by a predetermined voltage for each read voltage.

Figure 15:
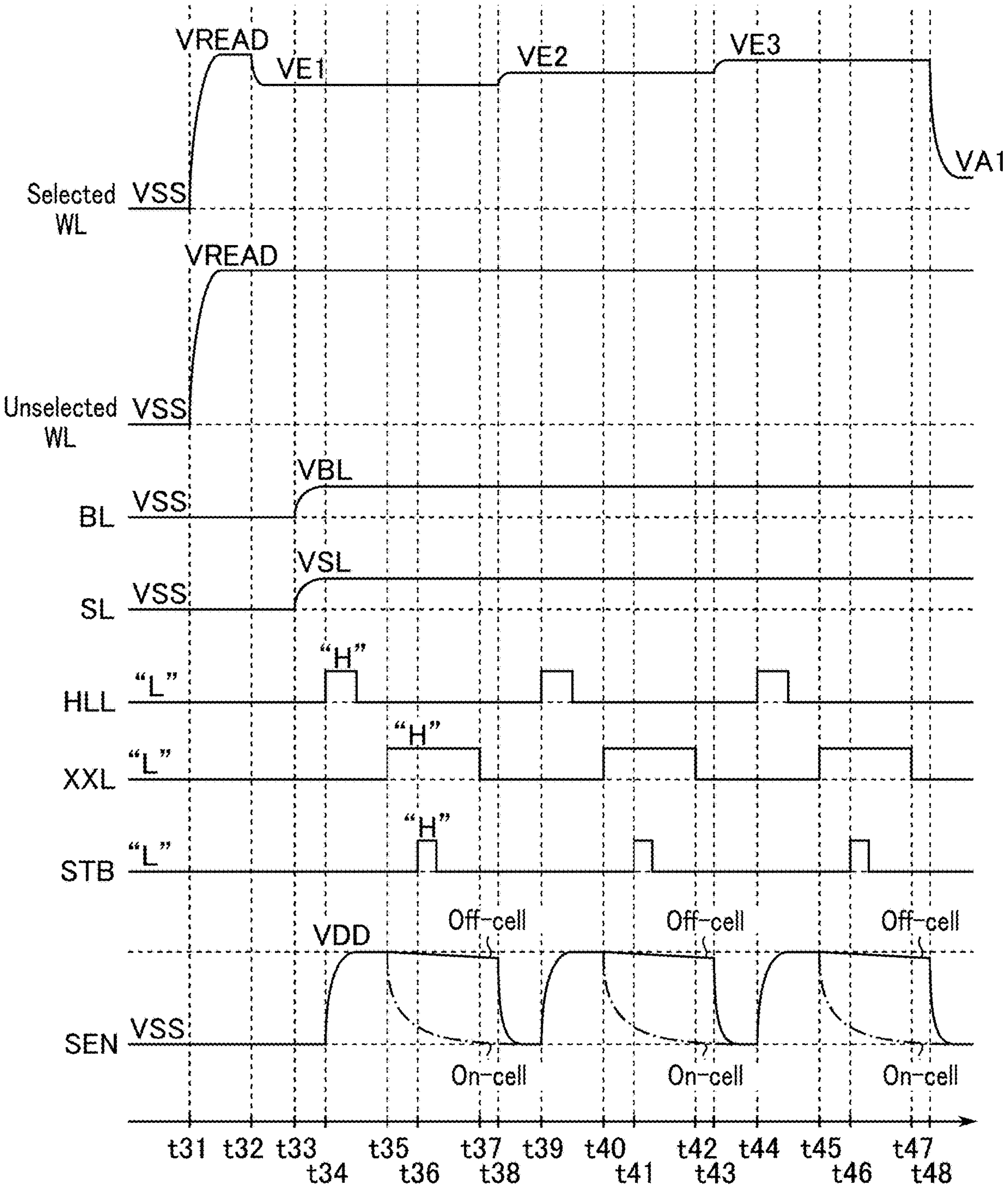
FIG. 15 is a timing chart for explaining the read process during the optimum read voltage determining process in the non-volatile memory according to the second modification of the first embodiment.

With reference to FIG. 15, a description will be given of a read process at the time of the optimum read voltage determining process in the non-volatile memory according to the second modification of the first embodiment. FIG. 15 is a timing chart for explaining the read process during the optimum read voltage determining process in the non-volatile memory according to the second modification of the first embodiment. FIG. 15 illustrates the read process for the voltage VE in the lower page. That is, a case where the read process using the voltages VE1, VE2, and VE3 is executed is illustrated.

At time t31, the voltage VREAD is applied to the selected word line WL and the unselected word line WL, similarly to the operation at time t11.

At time t32, the row decoder module 17 applies a voltage VE1 to the selected word line WL.

At time t33, the voltages VBL and VSL are applied to the bit line BL and the source line SL, respectively, similarly to the operation at time t13.

At time t34, similarly to the operation at time t14, the voltage VDD is precharged to the node SEN in the sense amplifier unit SAU.

At time t35, similarly to the operation at time t15, the sequencer 15 sets the signal XXL from the "L" level to the "H" level to turn on the transistor Tr3. Then, in a period from time t35 to time t36, it is determined whether the threshold voltage Vth is equal to or lower than the read voltage VE1. More specifically, when the threshold voltage of the selected memory cell transistor MT is higher than the read voltage VE1 (if the selected memory cell transistor MT is an off-cell), the voltage of the node SEN is maintained at the voltage of the "H" level that turns on the transistor Tr6 at time t36. When the threshold voltage of the selected memory cell transistor MT is equal to or lower than the read voltage VE1 (if the selected memory cell transistor MT is an on-cell), the voltage at the node SEN decreases to the voltage at the "L" level that turns off the transistor Tr6 at time t36.

At time t36, the sequencer 15 changes the voltage of the signal STB from the "L" level to the "H" level. Then, the sequencer 15 maintains the signal STB at the voltage of the "H" level for a predetermined period. As a result, when the bus LBUS is at the "H" level, "1" data is stored in the latch circuit ADL. When the bus LBUS is at the "L" level, "0" data is stored in the latch circuit ADL. That is, the storage of the read data in S11 is performed.

At time t37, the sequencer 15 changes the signal XXL from the "H" level to the "L" level to turn off the transistor Tr3, similarly to the operation at time t19.

The read process using the read voltage VE1 is executed in the above manner. In addition, read data at the read voltage VE1 is acquired.

At time t38, for example, the row decoder module 17 applies the voltage VE2 to the selected word line WL. In addition, the voltage of the node SEN is set as the voltage VSS.

The operation from time t39 to time t42 is substantially the same as the operation from time t34 to time t37 except that the read voltage VE2 is used instead of the read voltage VE1. As a result, the read process using the read voltage VE2 is executed. In addition, the storage of the read data in S12 is performed.

At time t44, for example, the row decoder module 17 applies the voltage VE3 to the selected word line WL. In addition, the voltage of the node SEN is set as the voltage VSS.

The operation from the time t45 to the time t47 is substantially similar to the operation from the time t34 to the time t37 or the operation from the time t39 to the time t42 except that the read voltage VE3 is used instead of the read voltage VE1 or VE2. As a result, the read process using the read voltage VE3 is executed. In addition, the storage of the read data in S13 is performed.

At time t48, for example, the row decoder module 17 applies the voltage VA1 to the selected word line WL. In addition, the voltage of the node SEN is set as the voltage VSS. Then, similarly to the read process using the read voltages VE1, VE2, and VE3, a read process using the read voltages VA1, VA2, and VA3 is executed. The read process for the optimum read voltage determining process is thus completed.

The same effects as those of the first embodiment are also provided by the second modification of the first embodiment.

3 Second Embodiment

In the first embodiment and the first and second modifications of the first embodiment described above, cases where the non-volatile memory 10 executes the tracking operation using the read voltage Vdef as the read voltage V2 have been described, but the present invention is not limited thereto. The non-volatile memory 10 may execute the tracking operation using a read voltage shifted from a specified read voltage as the read voltage V2 according to the tracking operation up to the previous time.

In the following, the configuration and operation of the memory system 1 according to the second embodiment different from those of the memory system according to the first embodiment will be described.

The configuration of the memory system 1 according to the second embodiment can be similar to that of the memory system 1 according to the first embodiment except that the volatile memory 30 stores a shift amount table regarding the shift amount for each read voltage. The shift amount table will be described below with reference to FIG. 16. FIG. 16 is a diagram illustrating an example of the shift amount table used in the memory system according to the second embodiment.

In the tracking operation according to the second embodiment, for each read voltage of the target page, the non-volatile memory 10 sets the read voltage Vdef or a voltage obtained by adding a shift amount to the read voltage Vdef as the read voltage V2 based on a command of the tracking operation, for example. The read voltage V2 is selected or designated based on, for example, an address included in the command. The shift amount is a value calculated for each read voltage based on the sum of the differences between the optimum read voltage and the read voltage V2 in the tracking operations that have already been executed. More specifically, when a tracking operation has been executed, the shift amount is updated to a value obtained by adding a value obtained by subtracting the read voltage V2 from the optimum read voltage in that tracking operation to the current shift amount. For example, in a case where the optimum read voltage is the read voltage V1 in the tracking operation, the shift amount is updated to a value obtained by subtracting the difference between the read voltages V2 and V1 from the current shift amount. Furthermore, for example, in a case where the optimum read voltage is the read voltage V2 in the tracking operation, the shift amount is maintained. For example, in a case where the optimum read voltage is the read voltage V3 in the tracking operation, the shift amount is updated to a value obtained by adding the difference between the read voltages V3 and V2 to the current shift amount. In a case where the read voltage Vdef is selected as the read voltage V2 for each read voltage based on the command of the tracking operation, the shift amount is reset. That is, the shift amount corresponding to the read voltage is set to zero. Note that the update and reset of the shift amount are executed by, for example, the sequencer 15 and the arithmetic circuit 19.

The shift amount table stores, for example, the read voltage Vdef and shift amounts CVA to CVG for each read voltage. All or part of the information included in the shift amount table can also be stored in the non-volatile memory 10. Note that, as will be described later, the shift amount table may be configured to be able to store only shift amounts related to a certain number of read voltages. In the following description, when the shift amounts CVA to CVG are not distinguished from each other, the shift amounts CVA to CVG are each simply referred to as a shift amount CV.

Figure 17:
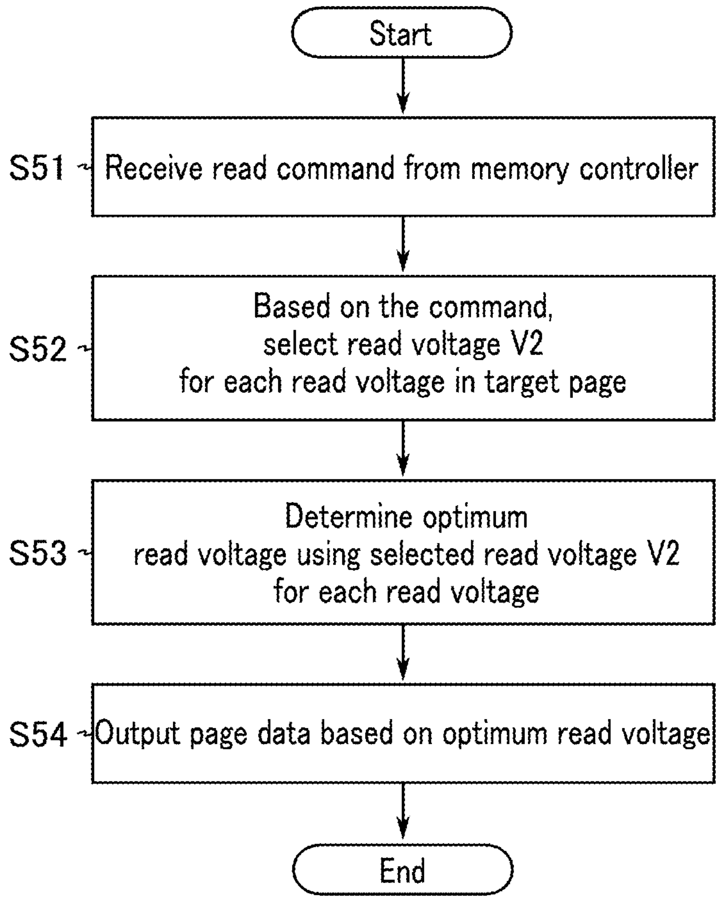
FIG. 17 is a flowchart for explaining the tracking operation in the non-volatile memory according to the second embodiment.

An overall operation of the tracking operation of the memory system 1 according to the second embodiment will be described with reference to FIG. 17. FIG. 17 is a flowchart for explaining the tracking operation in the non-volatile memory according to the second embodiment.

The non-volatile memory 10 receives, from the memory controller 20, a read command for instructing execution of a read process by executing the tracking operation (S51).

When the read command is received as described above, the sequencer 15 selects, for example, based on the command of the tracking operation, and for each read voltage of the target page, the read voltage Vdef or a voltage obtained by adding the shift amount CV to the read voltage Vdef as the read voltage V2 (S52). When the read voltage Vdef is selected as the read voltage V2, the shift amount CV of the read voltage is reset.

Then, the non-volatile memory 10 determines the optimum read voltage for each read voltage based on the selected read voltage V2 as in the first embodiment (S53).

Then, the non-volatile memory 10 outputs the page data determined based on the read data at the optimum read voltage determined in S53 to the memory controller 20 (S54).

Furthermore, for example, before the next tracking operation is executed, based on the information on the selected latch circuit stored in the arithmetic circuit 19, the shift amount CV is updated to a value obtained by adding a value obtained by subtracting the read voltage V2 from the optimum read voltage to the current shift amount CV.

In the example illustrated in FIG. 16, an example in which the shift amount table stores the shift amounts CV related to all the read voltages has been described, but the present invention is not limited thereto. In the second embodiment, for example, a plurality of tracking operations for the same page among the upper page, the middle page, and the lower page is continuously executed. Then, the shift amount CV of the read voltage related to the page among the read voltages VA to VG is updated. As a result, the shift amount table may be configured to store the shift amount CV for the maximum value of the number of read voltages for each page, for example. For example, since the maximum value of the number of read voltages for each of the upper page, the middle page, and the lower page is three, the shift amount table may be configured to be able to store three shift amounts CV in association with the read voltages.

The same effects as those of the first embodiment are also provided by the second embodiment.

In addition, since the tracking operation is executed based on the read voltage V2 corresponding to the shift amount CV of each read voltage, the accuracy of the read process can be improved.

4 Others

In the first embodiment, the first and second modifications of the first embodiment, and the second embodiment described above, cases where the tracking operation is executed in the non-volatile memory 10 have been described, but the present invention is not limited thereto. For example, the various arithmetic operations using the data stored in the latch circuits by the arithmetic circuit 19, calculation of the differences Δ1, Δ2, and Δ3 in the number of on-cells, and various types of processing for determining the optimum read voltage based on this calculation in these embodiments may be executed by, for example, a configuration included in the memory controller 20 in the memory system 1.

In the first embodiment, the first and second modifications of the first embodiment, and the second embodiment described above, cases where eight states are formed by the threshold voltages of the plurality of memory cell transistors MT in the non-volatile memory have been described. However, the present invention is not limited thereto. For example, in the non-volatile memory, 2 states, 4 states, or 16 states may be formed by the threshold voltages of the plurality of memory cell transistors MT. For example, when 2 states are formed by the threshold voltages of the plurality of memory cell transistors MT, the page data can be determined using one read voltage between the two states. When the page data is determined using one read voltage as in this example, the non-volatile memory outputs the read data at the optimum read voltage determined as illustrated in FIG. 10 or the read data at the optimum read voltage determined as illustrated in FIG. 14 to the memory controller as page data.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A non-volatile memory comprising:

a plurality of memory cells;

a word line coupled to the memory cells; and a controller configured to perform a read process to read data from the memory cells by applying a voltage to the word line, wherein, in the read process for the memory cells, the controller is configured to apply a first voltage to the word line, read data from the memory cells at a first timing, read data from the memory cells at a second timing later than the first timing, and reads data from the memory cells at a third timing later than the second timing while the first voltage is applied to the word line, calculate a first difference between a number of memory cells based on the data read from the memory cells at the first timing and a number of memory cells based on the data read from the of memory cells at the second timing, a second difference between the number of memory cells based on the data read from the memory cells at the second timing and a number of memory cells based on the data read from the memory cells at the third timing, and a first value obtained by subtracting the first difference from the second difference, and determine, based on the first value, one of the data read from the memory cells at the first timing, the data read from the memory cells at the second timing, and the data read from the memory cells at the third timing as a plurality of pieces of first read data from the memory cells.

2. The non-volatile memory according to claim 1, wherein the controller determines the data read from the memory cells at the first timing as the pieces of first read data in a case where the first value is a positive value and the first value is larger than a first threshold, determines the data read from the memory cells at the second timing as the pieces of first read data in a case where the first value is a positive value and the first value is equal to or smaller than the first threshold, and in a case where the first value is equal to or smaller than 0, and a second value obtained by subtracting the second difference from the first difference is equal to or smaller than a second threshold, and determines the data read from the memory cells at the third timing as the pieces of first read data in a case where the first value is equal to or smaller than 0 and the second value is larger than the second threshold.

3. The non-volatile memory according to claim 1, further comprising an input/output circuit, wherein the non-volatile memory is connectable to an external memory controller of the non-volatile memory via the input/output circuit, and the controller transmits the pieces of first read data to the memory controller in response to a read command received from the memory controller via the input/output circuit.

4. The non-volatile memory according to claim 1, further comprising a word line adjacent to the word line, wherein, while the first voltage is being applied to the word line, the controller applies a second voltage higher than the first voltage to the adjacent word line.

5. The non-volatile memory according to claim 1, wherein the controller performs, for each of the memory cells, an exclusive OR operation of a plurality of pieces of first data that are pieces of data read from the memory cells at the first timing and a plurality of pieces of second data that are pieces of data read from the memory cells at the second timing, and uses a number of bits having a value of 1 among pieces of data obtained by the exclusive OR operation of the pieces of first data and the pieces of second data as the first difference.

6. The non-volatile memory according to claim 5, wherein the controller performs, for each of the memory cells, an exclusive OR operation of the pieces of second data and a plurality of pieces of third data that are pieces of data read from the memory cells at the third timing, and uses a number of bits having a value of 1 among pieces of data obtained by the exclusive OR operation of the pieces of second data and the pieces of third data as the second difference.

7. The non-volatile memory according to claim 6, wherein the plurality of pieces of first data are 0 or 1, respectively, the plurality of pieces of second data are 0 or 1, respectively, the plurality of pieces of third data are 0 or 1, respectively, the plurality of pieces of first read data are 0 or 1, respectively.

8. The non-volatile memory according to claim 6, wherein the controller includes a plurality of first latch circuits, a plurality of second latch circuits, a plurality of third latch circuits, and a plurality of fourth latch circuits respectively corresponding to the memory cells, stores the pieces of first data in the first latch circuits, stores the pieces of second data in the second latch circuits, stores the pieces of third data in the third latch circuits, stores the pieces of first read data in the fourth latch circuits, each of the first latch circuits corresponds to read data from each of the memory cells, each of the second latch circuits corresponds to read data from each of the memory cells, and each of the third latch circuits corresponds to read data from each of the memory cells.

9. The non-volatile memory according to claim 8, wherein the memory cells can each store data of two or more bits, in the read process for the memory cells, the controller applies a third voltage different from the first voltage to the word line after the first read data is determined, reads data from the memory cells at a fourth timing, reads data from the memory cells at a fifth timing later than the fourth timing, and reads data from the memory cells at a sixth timing later than the fifth timing while the third voltage is applied to the word line, calculates a third difference between a number of memory cells based on the data read from the memory cells at the fourth timing and a number of memory cells based on the data read from the memory cells at the fifth timing, a fourth difference between the number of memory cells based on the data read from the memory cells at the fifth timing and a number of memory cells based on the data read from the memory cells at the sixth timing, and a second value obtained by subtracting the third difference from the fourth difference, and determines, based on the second value, one of the data read from the memory cells at the fourth timing, the data read from the memory cells at the fifth timing, and the data read from the memory cells at the sixth timing as a plurality of pieces of second read data of the memory cells.

10. The non-volatile memory according to claim 9, wherein the controller determines the data read from the memory cells at the first timing as the pieces of first read data in a case where the first value is a positive value and the first value is larger than a first threshold, determines the data read from the memory cells at the second timing as the pieces of first read data in a case where the first value is a positive value and the first value is equal to or smaller than the first threshold, and in a case where the first value is equal to or smaller than 0, and a third value obtained by subtracting the second difference from the first difference is equal to or smaller than a second threshold, and determines the data read from the memory cells at the third timing as the pieces of first read data in a case where the first value is equal to or smaller than 0 and the third value is larger than the second threshold.

11. The non-volatile memory according to claim 10, wherein the controller determines the data read from the memory cells at the fourth timing as the pieces of second read data in a case where the second value is a positive value and the second value is larger than the first threshold, determines the data read from the memory cells at the fifth timing as the pieces of second read data in a case where the second value is a positive value and the second value is equal to or smaller than the first threshold, and in a case where the second value is equal to or smaller than 0, and a fourth value obtained by subtracting the fourth difference from the third difference is equal to or smaller than the second threshold, and determines the data read from the memory cells at the sixth timing as the pieces of second read data in a case where the second value is equal to or smaller than 0 and the fourth value is larger than the second threshold.

12. The non-volatile memory according to claim 9, further comprising an input/output circuit, wherein the non-volatile memory is connectable to an external memory controller of the non-volatile memory via the input/output circuit, and the controller transmits data based on the pieces of first read data and the pieces of second read data to the memory controller in response to a read command received from the memory controller via the input/output circuit.

13. The non-volatile memory according to claim 9, wherein the data based on the pieces of first read data and the pieces of second read data is a result of a logical operation of the pieces of first read data and the pieces of second read data.

14. The non-volatile memory according to claim 9, further comprising a word line adjacent to the word line, wherein, while the first voltage is being applied to the word line and while the third voltage is being applied to the word line, the controller applies a fourth voltage higher than the first and third voltages to the adjacent word line.

15. The non-volatile memory according to claim 9, wherein the third voltage is lower than the first voltage.

16. The non-volatile memory according to claim 9, wherein the first voltage is lower than the third voltage.

17. The non-volatile memory according to claim 9, wherein the controller performs, for each of the memory cells, an exclusive OR operation of a plurality of pieces of fourth data that are pieces of data read from the memory cells at the fourth timing and a plurality of pieces of fifth data that are pieces of data read from the memory cells at the fifth timing, uses a number of bits having a value of 1 among pieces of data obtained by the exclusive OR operation of the pieces of fourth data and the pieces of fifth data as the third difference, and performs, for each of the plurality of memory cells, an exclusive OR operation of the pieces of fifth data and a plurality of pieces of sixth data that are pieces of data read from the memory cells at the sixth timing, and uses a number of bits having a value of 1 among pieces of data obtained by the exclusive OR operation of the pieces of fifth data and the pieces of sixth data as the fourth difference.

18. The non-volatile memory according to claim 17, wherein the controller includes a plurality of first latch circuits, a plurality of second latch circuits, a plurality of third latch circuits, and a plurality of fourth latch circuits, stores the pieces of fourth data in the first latch circuits, stores the pieces of fifth data in the second latch circuits, stores the pieces of sixth data in the third latch circuits, and performs, for each of the memory cells, an exclusive NOR operation of the pieces of first read data stored in the fourth latch circuits and the pieces of second read data stored, and stores data obtained by the exclusive NOR operation in the fourth latch circuits.

19. A method of controlling a non-volatile memory comprising a plurality of memory cells and a word line coupled to the memory cells, the method comprising reading data from the memory cells by applying a voltage to the word line, wherein the reading data from the memory cells includes applying a first voltage to the word line, reading data from the memory cells at a first timing, reading data from the memory cells at a second timing later than the first timing, and reading data from the memory cells at a third timing later than the second timing while the first voltage is applied to the word line, calculating a first difference between a number of memory cells based on the data read from the memory cells at the first timing and a number of memory cells based on the data read from the of memory cells at the second timing, a second difference between the number of memory cells based on the data read from the memory cells at the second timing and a number of memory cells based on the data read from the memory cells at the third timing, and a first value obtained by subtracting the first difference from the second difference, and determining, based on the first value, one of the data read from the memory cells at the first timing, the data read from the memory cells at the second timing, and the data read from the memory cells at the third timing as a plurality of pieces of first read data from the memory cells.

20. The method according to claim 19, wherein calculating the first difference includes performing, for each of the memory cells, an exclusive OR operation of a plurality of pieces of first data that are pieces of data read from the memory cells at the first timing and a plurality of pieces of second data that are pieces of data read from the memory cells at the second timing, and using a number of bits having a value of 1 among pieces of data obtained by the exclusive OR operation of the pieces of first data and the pieces of second data as the first difference.

* * * * *